United States Patent
Kanan et al.

(10) Patent No.: US 11,799,297 B1
(45) Date of Patent: Oct. 24, 2023

(54) SYSTEMS AND METHODS FOR OFFSETTING PARASITIC ENERGY LOSSES OF A BATTERY ENERGY STORAGE SYSTEM

(71) Applicant: 8ME NOVA, LLC, El Dorado Hills, CA (US)

(72) Inventors: Nadim Kanan, Elk Grove, CA (US); Lukas Hansen, El Dorado Hills, CA (US)

(73) Assignee: 8ME NOVA, LLC, El Dorado Hills, CA (US)

(*) Notice: Subject to any disclaimer, the term of this patent is extended or adjusted under 35 U.S.C. 154(b) by 0 days.

(21) Appl. No.: 17/876,056

(22) Filed: Jul. 28, 2022

Related U.S. Application Data

(60) Provisional application No. 63/391,125, filed on Jul. 21, 2022.

(51) Int. Cl.
*H02J 3/38* (2006.01)
*H02J 3/32* (2006.01)
*H02J 7/00* (2006.01)
*G01R 21/133* (2006.01)

(52) U.S. Cl.
CPC ............ *H02J 3/381* (2013.01); *G01R 21/133* (2013.01); *H02J 3/32* (2013.01); *H02J 7/0013* (2013.01); *H02J 7/0063* (2013.01); *H02J 7/0071* (2020.01); *H02J 7/00712* (2020.01); *H02J 2300/20* (2020.01)

(58) Field of Classification Search
None
See application file for complete search history.

(56) References Cited

U.S. PATENT DOCUMENTS

| | | | |
|---|---|---|---|
| 7,469,541 B1 | 12/2008 | Melton et al. | |
| 2009/0076661 A1 | 3/2009 | Pearson et al. | |
| 2011/0215640 A1 | 9/2011 | Donnelly et al. | |
| 2013/0057196 A1 | 3/2013 | Ku et al. | |
| 2018/0356782 A1* | 12/2018 | ElBsat | H02J 3/003 |
| 2020/0387981 A1* | 12/2020 | Tinio | G06Q 30/0206 |
| 2022/0065162 A1* | 3/2022 | Hunt | F02C 3/20 |

* cited by examiner

*Primary Examiner* — Mohammad Ali
*Assistant Examiner* — Saad M Kabir
(74) *Attorney, Agent, or Firm* — Foley & Lardner LLP

(57) ABSTRACT

A method may include measuring, by a processor from a load energy meter, energy provided to an energy grid or from the energy grid or a renewable energy source (RES) to a renewable energy power plant; determining, by the processor based on the measuring, a battery energy storage system is not providing enough energy to satisfy energy requirements of a device operating in the renewable energy power plant; identifying, by the processor based on the measuring, an amount of energy that is needed to satisfy the energy requirements of the device in combination with energy provided by a battery energy storage system to the device; and directing, by the processor, the identified amount of energy from the RES to the device.

19 Claims, 11 Drawing Sheets

SYSTEMS AND METHODS FOR OFFSETTING PARASITIC ENERGY LOSSES OF A BATTERY ENERGY STORAGE SYSTEM

CROSS-REFERENCE TO RELATED APPLICATION

This application claims the benefit of priority to U.S. Provisional Application No. 63/391,125, filed Jul. 21, 2022, the entirety of which is incorporated by reference herein.

BACKGROUND

Several industrial applications may implement the use of a battery energy storage system ("BESS") for the use of storing, and later providing, electrical energy. A BESS may include one or more transformers that protect and enable the BESS to distribute large amounts of energy across transmission lines.

The BESS may be stored inside a renewable energy facility. For instance, the BESS may be configured to power or energize equipment operating within the renewable energy facility to ensure the renewable energy facility remains up and running. To obtain the energy that is needed to power the equipment, the BESS may be charged over different periods of a day. The BESS may be charged by an energy grid connected to the renewable energy facility, depending on the availability of energy from the grid. In some cases, the BESS may provide energy to the energy grid to enable the energy grid to provide energy to other loads that require energy to operate.

SUMMARY

During operation, there may be times in which the BESS is not charging or discharging energy to the energy grid. During these times, the BESS may be in a "standby state" in which the BESS inherently consumes small amounts of energy to remain operational without having any other productive uses of the energy the BESS stores. A portion of the energy that is lost may be from parasitic losses of a transformer of the BESS. Other examples of losses may include idle inverter losses and losses incurred by equipment naturally by being connected to the system, even if the equipment is not operating to charge or discharge the BESS.

In some cases, equipment operating in the same facility as the BESS may be powered by the BESS. However, the natural losses that the BESS may incur may result in the BESS not being able to sufficiently power the equipment. To account for such natural, an operator may request energy from an energy grid. However, depending on the time of day and/or the number of loads that need energy, the energy that is needed to overcome the losses may not be available or may be restricted. Accordingly, the equipment within the renewable energy plant may not be always sufficiently powered during the periods in which the BESS is operating in standby mode.

A processor implementing the systems and methods discussed herein may overcome the aforementioned technical deficiencies by controlling an energy offset system connected to devices within a renewable energy facility. The energy offset system may include one or both of a second BESS or a renewable energy source (RES) (e.g., one or more solar panels, wind turbines, etc.) that can provide power to the devices within the renewable energy facility. Depending on the configuration, the processor may control the energy that is available from the second BESS and/or the renewable energy source to send energy to the devices within the facility. Because the energy offset system includes additional components to the original BESS, the energy offset system may account for any losses the BESS incurs when in an idle state.

In some cases, the processor may be disconnected from the system controlling the BESS in the renewable energy facility. In such cases, the processor may control the added RES and/or second BESS of the energy offset system by reading meter readings of a load energy meter connected in series between the devices the BESS powers and the energy grid. For example, the load energy meter may be configured to read the amount of energy that flows from the BESS to the energy grid and from the energy grid to the meter. When the BESS stops charging or discharging through the meter, the energy grid may send energy through the meter to power the devices in the renewable energy facility to make up for any losses the BESS incurs while operating in standby mode. The processor may read the amount of energy the grid provides from the energy meter and direct the read amount of energy to the devices from the energy offset system. By doing so, the grid may stop providing energy to power the devices and instead distribute energy to other loads, thus reducing the stress placed on the grid when ensuring the equipment in the renewable energy facility remains powered.

In some embodiments, the devices operating within the renewable energy facility may not be powered by the BESS at all. For example, the devices may not be connected to the BESS and may instead be connected to the energy offset system, which may be connected to other renewable energy sources in the renewable energy facility and/or the energy grid. The processor controlling the energy offset system may power the devices using the energy offset system until the energy offset system does not have enough power to do so. The processor may then retrieve energy from other renewable energy sources of the renewable energy facility to power the devices. If the other renewable energy sources do not generate enough energy to power the devices, the processor may retrieve energy from the energy grid to power the devices. In this way, the processor may avoid relying on energy from the BESS to power the devices and, therefore, avoid encountering the issue of natural energy losses at the BESS.

Advantageously, by performing the systems and methods described herein, the processor may improve the energy load requirements of the renewable energy power plant without directly integrating a new controller into the renewable energy power plant. By controlling an extra BESS and/or renewable energy source to power devices the BESS is configured to provide power, a controller may ensure the devices can continue to operate only by reading the value on the meter between the BESS and the energy grid. This integration may enable a temporary energy offset system to be installed into a renewable energy plant while a new BESS is sized and installed to be able to handle energy losses. The integration may also enable a lay person to integrate the energy offset system into a renewable energy facility without configuring a connection between the controller controlling the BESS and the controller of the energy offset system. In doing so, the energy offset system may provide power to the devices and enable the energy grid to provide energy to other loads, reducing the load requirements placed on the energy grid.

In an aspect, the present disclosure describes a system. The system may comprise a renewable energy power plant coupled to an energy grid, the renewable energy power plant comprising a battery energy storage system (BESS); a device operating within the renewable energy power plant having energy requirements and receiving energy from the BESS; a load energy meter measuring energy provided to the energy grid or from either the energy grid or a first renewable energy source (RES); a second RES; and a processor, the processor operatively coupled to computer memory and configured by machine-readable instructions to measure, from the load energy meter, the energy provided to or from the energy grid or the first RES; determine, based on the measurement, the BESS is not providing enough energy to satisfy the energy requirements of the device; identify, based on the measurement, an amount of energy that is needed to satisfy the energy requirements of the device in combination with the energy provided by the BESS to the device; and direct the identified amount of energy from the second RES to the device.

In some embodiments, the processor is configured to identify the amount of energy that is needed to satisfy the energy requirements of the device by identifying the amount of energy responsive to determining the BESS is not charging or discharging energy to or from the energy grid or the first RES. In some embodiments, the processor is configured to determine the BESS is not charging or discharging energy to or from the energy grid or the first RES by determining the BESS is not charging or discharging energy to or from the energy grid or the first RES based on a charge/discharge schedule for the BESS.

In some embodiments, the processor is configured to determine the BESS is not charging or discharging energy to or from the energy grid or the first RES responsive to a value of the load energy meter being below a threshold. In some embodiments, the processor is further configured to charge a second BESS with energy generated by the second RES during a first time period; determine the BESS is not providing enough energy to satisfy the energy requirements of the device during a second time period subsequent to the first time period; calculate a second amount of energy that is needed to satisfy the energy requirements of the device in combination with energy provided by the BESS; and discharge the calculated second amount of energy from the second BESS to the device during the second time period.

In some embodiments, the processor is configured to determine the BESS is not providing enough energy to satisfy the energy requirements of the device by determining the BESS in combination with the second RES is not providing enough energy to satisfy the energy requirements of the device during the second time period; and wherein the processor is configured to calculate the second amount of energy by calculating the second amount of energy that is needed to satisfy the energy requirements of the device in combination with energy provided by the BESS and the second RES. In some embodiments, the load energy meter is coupled in series between the device and the energy grid.

In another aspect, the present disclosure describes a method. The method may include measuring, by a processor from a load energy meter, energy provided to an energy grid or from either the energy grid or a first renewable energy source (RES) of a renewable energy power plant; determining, by the processor based on the measuring, a battery energy storage system (BESS) is not providing enough energy to satisfy energy requirements of a device operating in the renewable energy power plant; identifying, by the processor based on the measuring, an amount of energy that is needed to satisfy the energy requirements of the device in combination with energy provided by the BESS to the device; and directing, by the processor, the identified amount of energy from a second RES to the device.

In some embodiments, identifying the amount of energy that is needed to satisfy the energy requirements of the device comprises identifying, by the processor, the amount of energy responsive to determining the BESS is not charging or discharging energy to or from the energy grid or the first RES. In some embodiments, determining the BESS is not charging or discharging energy to or from the energy grid comprises determining, by the processor, the BESS is not charging or discharging energy to or from the energy grid or the first RES based on a charge/discharge schedule for the BESS. In some embodiments, the method comprises determining, by the processor, the BESS is not charging or discharging energy to or from an RES in addition to or instead of the energy grid by monitoring or retrieving values from the load energy meter.

In some embodiments, the method further comprises charging, by the processor, a second BESS with energy generated by the second RES during a first time period; determining, by the processor, the BESS is not providing enough energy to satisfy the energy requirements of the device during a second time period subsequent to the first time period; calculating, by the processor, a second amount of energy that is needed to satisfy the energy requirements of the device in combination with energy provided by the BESS; and discharging, by the processor, the calculated second amount of energy from the second BESS to the device during the second time period.

In some embodiments, determining the BESS is not providing enough energy to satisfy the energy requirements of the device comprises determining, by the processor, the BESS in combination with the second RES is not providing enough energy to satisfy the energy requirements of the device during the second time period. In some embodiments, calculating the second amount of energy comprises calculating, by the processor, the second amount of energy that is needed to satisfy the energy requirements of the device in combination with energy provided by the BESS and the second RES.

In some embodiments, the method further comprises determining, by the processor, the second time period is a time period in which the second RES does not generate energy; wherein discharging the calculated second amount of energy from the second BESS comprises discharging, by the processor, the calculated second amount of energy from the second BESS in response to determining the second time period is a time period in which the second RES does not generate energy. In some embodiments, measuring the load energy meter comprises measuring, by the processor, the load energy meter coupled in series between the device and the energy grid.

In some embodiments, identifying the amount of energy of energy that is needed to satisfy the energy requirements of the device in combination with energy provided by the BESS is performed at a first time. The method may further include identifying, by the processor at a second time subsequent to the first time, a second amount of energy that is needed to satisfy the energy requirements of the device in combination with energy provided by the BESS, the second amount of energy higher than the amount of energy and resulting from parasitic losses of a transformer of the BESS in an idle state; and directing, by the processor, the identified second amount of energy from the second RES to the device.

In some embodiments, directing the identified amount of energy from the second RES to the device comprises directing, by the processor, the identified amount of energy from the second RES to the device without transferring any energy to the BESS from the second RES. In some embodiments, measuring the energy requirements of the device operating in the renewable energy power plant comprises measuring, by the processor, the energy requirements of heating ventilation and air conditioning (HVAC) devices. In some embodiments, the method further comprises establishing, by the processor, a connection with a second processor controlling the BESS; receiving, by the processor, a state of charge of the BESS or a request for energy from the second processor; and directing, by the processor, energy from the second RES to the BESS based on the received state of charge or the request for energy from the second processor.

In some embodiments, the method further comprises charging a second BESS with energy generated by the second RES during a first time period; determining the BESS is not providing enough energy to satisfy the energy requirements of the device during a second time period subsequent to the first time period; and during the second time period, discharging, by the processor, energy from the second BESS to the device during the second time period; and increasing, by the processor, the energy being discharged from the second BESS to the device until measuring a value from the load energy meter equal to zero or a defined threshold.

In some embodiments, the processor is configured to calculate the beginning time of the temperature control time period by calculating the target temperature of the BESS based on a BESS temperature maximum and a predicted temperature increase of the BESS during the charge or discharge time period. In some embodiments, the processor is configured to control the equipment operating to control the temperature of the BESS for the temperature control time period by adjusting a state of operation of the equipment; measuring an increase in energy requirements of the equipment based on the adjusted state of operation; and increasing a maximum energy output of a solar panel based on the measured increase in energy requirements of the equipment.

In some embodiments, the processor is configured to control the equipment operating to control the temperature of the BESS for the temperature control time period further by directing, from the solar panel, an amount of energy substantially equal to the increase in the maximum energy output of the solar panel to the equipment operating to control the temperature of the BESS. In some embodiments, the processor is further configured to determine the amount of energy is not enough energy to enable the equipment to operate to control the temperature of the BESS to reach the target temperature; and responsive to the determination, direct energy from an energy grid or the BESS to the equipment. In some embodiments, the processor is further configured to calculate a difference between the energy requirements of the equipment and the increase in the maximum energy output of the solar panel, wherein the processor is configured to direct energy from the energy grid or the BESS to the equipment by directing an amount of energy substantially equal to the difference to the equipment.

In yet another aspect, the present disclosure describes a method. The method may include directing, by a processor, energy from a first renewable energy source (RES) and a battery energy storage system (BESS) to a device operating in a renewable energy power plant; determining, by the processor, the RES and the BESS are not capable of satisfying energy requirements of the device in the renewable energy power plant; responsive to the determining, retrieving, by the processor, energy from a second RES connected in series with the first RES; and directing, by the processor, the energy from the second RES to the device within the renewable energy power plant.

In some embodiments, the method may include determining, by the processor, the second RES is not capable of satisfying the energy requirements of the device; responsive to the determining the first RES, the BESS, and the second RES are not capable of satisfying the energy requirements of the device, retrieving, by the processor, energy from an energy grid through an energy meter; and directing, by the processor, the energy retrieved from the energy grid through the energy meter to the device.

In some embodiments, the method may include determining, by the processor, the BESS is charging; responsive to the determining the BESS is charging, retrieving, by the processor, second energy from the second RES; and directing, by the processor, the second energy from the second RES to the device within the renewable energy power plant.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings (also "Figure" and "FIG." herein), of which:

Figure 1A:
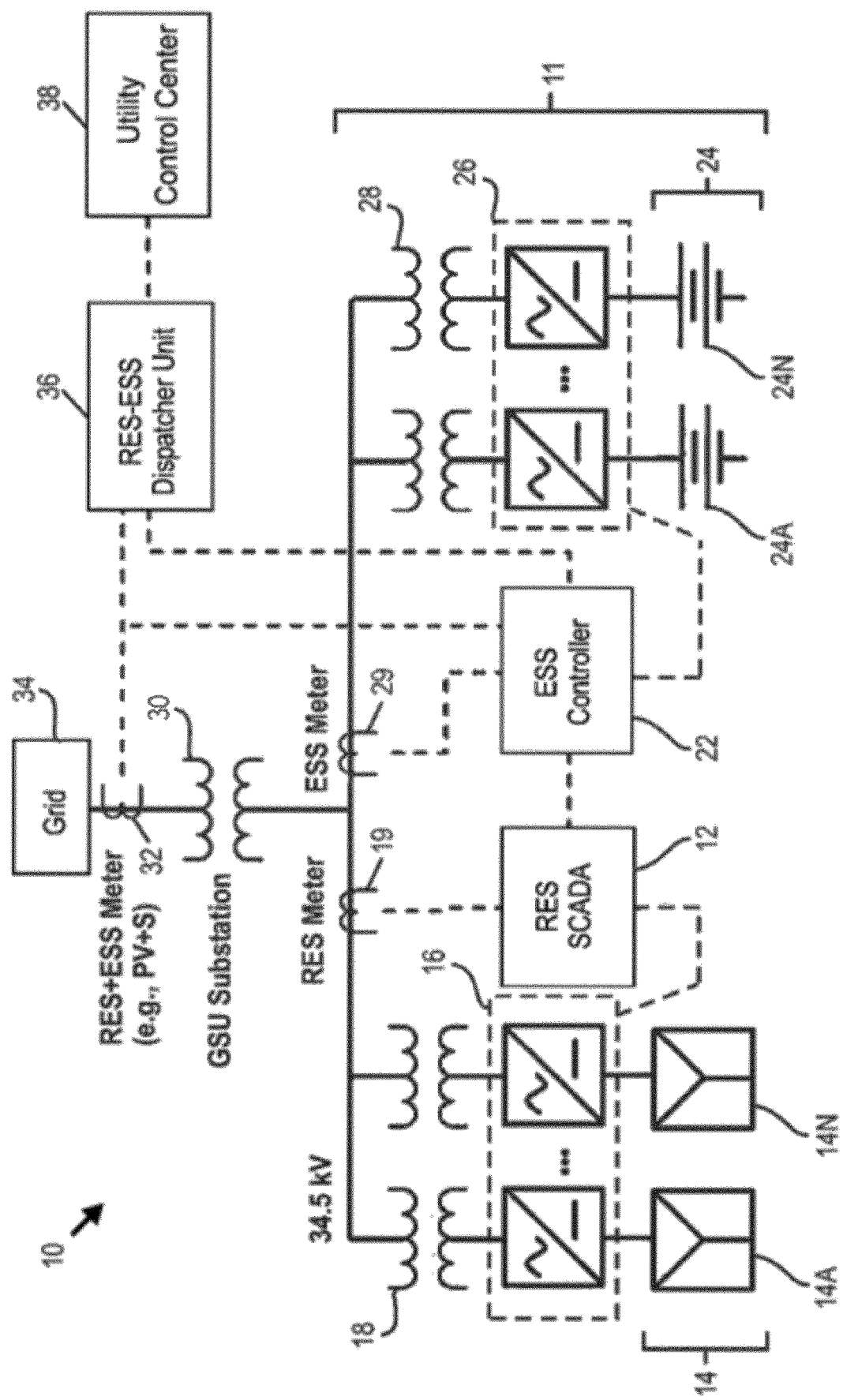
FIG. 1A is a schematic diagram of a metering and control system for controlling a renewable energy source and an energy storage system, according to some embodiments.

The foregoing and other features of the present disclosure will become apparent from the following description and appended claims, taken in conjunction with the accompanying drawings. Understanding that these drawings depict only several embodiments in accordance with the disclosure and are therefore, not to be considered limiting of its scope, the disclosure will be described with additional specificity and detail through use of the accompanying drawings.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Further, in the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

Energy Offset Management System

Referring now to FIG. 1A, a schematic diagram showing interconnections between various components of an AC coupled metering and control system 10 for controlling a renewable electrical energy generation device 14 including multiple generation units 14A-14N (such as a photovoltaic (PV) array including photovoltaic units) and an energy storage device 24 including multiple energy storage units 24A-24N (such as a battery array including battery units) chargeable with electric power produced by the renewable electrical energy generation device 14 in a RES-ESS facility 11 is shown, according to one embodiment. The RES-ESS facility 11 may combine a renewable electrical energy generation device 14 (e.g., such as an array of PV panels, wind turbines, or the like), and an energy storage device 24 (e.g., an array of lithium-based batteries) that may be coupled to a single substation 30 and/or located in a single property, area, or structure.

FIG. 1A illustrates an RES-ESS facility 11 that uses inverters 16, 26 to convert DC power produced by a renewable electrical energy generation device 14 (e.g., a PV array in certain embodiments) or power released by the energy storage device 24 to AC power for coupling to an AC electrical grid 34. In certain embodiments, the RES-ESS facility 11 may embody a DC coupled RES-ESS facility. In certain embodiments, an energy storage device 24 may include at least one of (or a combination of) energy storage units 24A, 24B using various constructions and chemistries, capacitors, or mechanical energy storage devices such as flywheels or pumped-hydro installations. In certain embodiments, an energy storage device 24 may include at least one hydrolysis unit (e.g., configured to electrolyze water to release hydrogen) and a hydrogen storage unit (e.g., adsorbent media for releasably binding hydrogen, storage vessels, and/or reversible chemical reactant vessels or beds). In certain embodiments, an energy storage device 24 may include electrical charge storage devices such as batteries, optionally augmented with capacitors.

In certain embodiments, a RES-ESS dispatcher unit 36 has the ability to control the charge or discharge of the energy storage device 24 (e.g., batteries) by communicating with an ESS controller 22. The ESS controller may be located in the RES-ESS facility 11. A RES SCADA (supervisory control and data acquisition) controller 12 may be operatively coupled with RES inverters 16 associated with the renewable electrical energy generation device 14 (optionally embodied in a PV array), and the ESS controller 22 may be operatively coupled with ESS inverters 26 associated with the energy storage device 24. Both the RES SCADA controller 12 and the ESS controller 22 may be in communication with the RES-ESS dispatcher unit 36. In certain embodiments, a utility control center 38 (e.g., of an electric power utility or grid operator) may communicate with the RES-ESS dispatcher unit 36 using DNP3 and set different configuration options. Additionally, the RES-ESS dispatcher unit 36 may receive or generate an accurate renewable generation forecast (e.g., solar generation forecast). The RES-ESS dispatcher unit 36 may use the forecast to implement the CCD and other control modes.

As shown in FIG. 1A, certain embodiments may utilize readily available electric power meters, such as a RES+ESS electrical power meter 32 to measure RES-ESS (e.g., PV+S) facility output, a RES electrical power meter 19 to measure RES output, and an ESS electrical power meter 29 to measure ESS output. Signals from the RES electrical power meter 19 are provided to the RES SCADA controller 12, and signals from the ESS electrical power meter 29 are provided to the ESS controller 22. The electric power generated by the RES-ESS facility 11 may be provided to an electric power system (e.g., an AC electrical grid 34) via a generator step-up (GSU) substation 30 that implements protection and appropriate voltage conversion. RES transformers 18 and ESS transformers 28 may be arranged between the inverters 16, 26, respectively, and the GSU substation 30 to provide voltage conversion utility (e.g., to supply AC power signals to the GSU substation 30 at 34.5 kV in certain implementations).

Figure 1B:
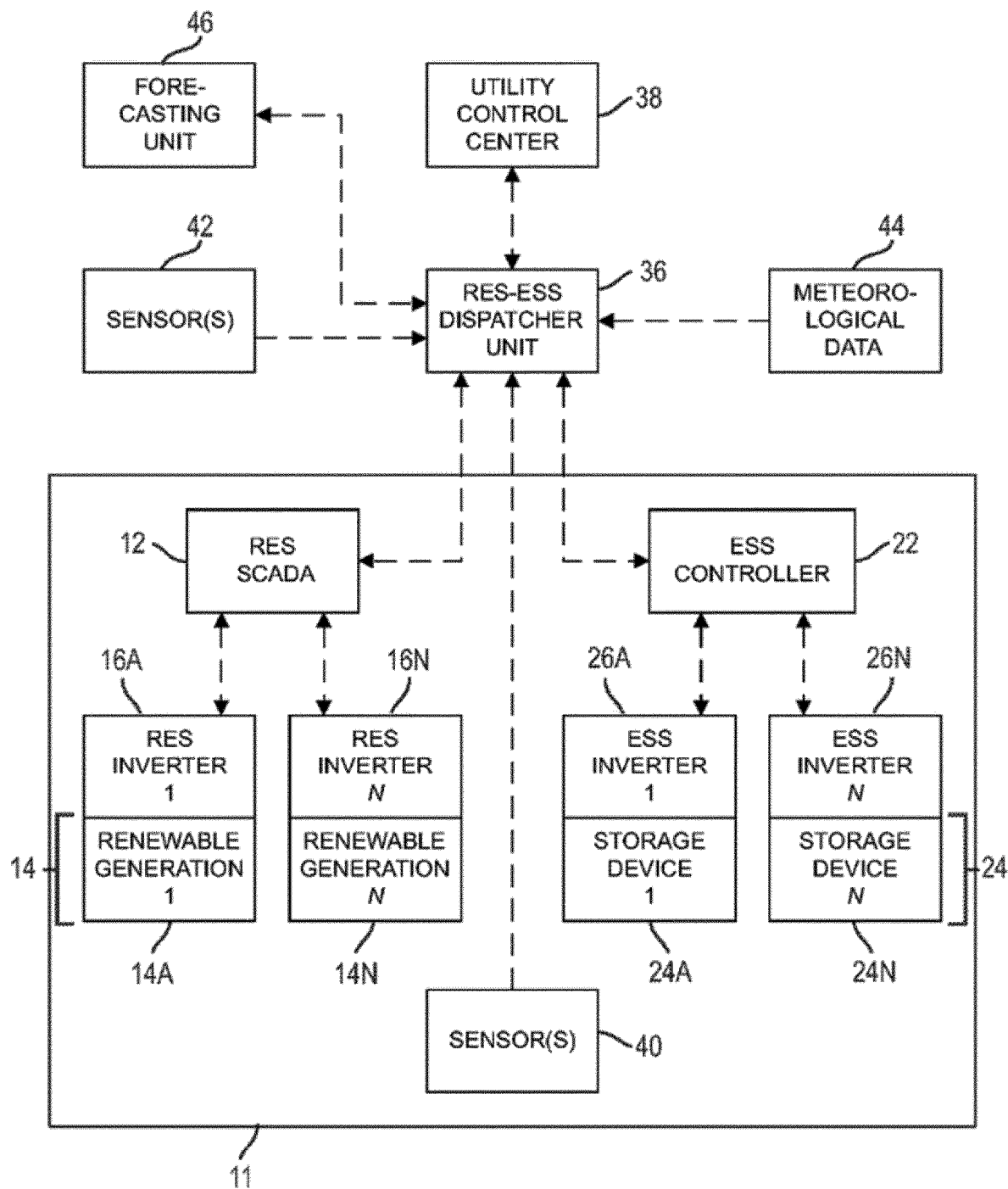
FIG. 1B is a schematic diagram showing certain components of the metering and control system of FIG. 1A, according to some embodiments.

Referring now to FIG. 1B, a schematic diagram showing certain components of the AC coupled metering and control system of FIG. 1A, including interconnection of control- and sensor-related components is shown, according to one embodiment. As shown in FIG. 1B, the RES-ESS dispatcher unit 36 may be arranged between a utility control center 38 and a RES-ESS facility 11. Within the RES-ESS facility 11, a RES SCADA controller 12 may be operatively coupled with RES inverters 16A-16N (wherein N represents any suitable number) that are configured to provide AC conversion of DC power produced by renewable electrical energy generation units 14A-14N (e.g., arrangeable as parts of a renewable electrical energy generation device 14). Similarly, within the RES-ESS facility 11, an ESS controller 22 may be operatively coupled with ESS inverters 26A-26N that are configured to provide AC conversion of DC power supplied by energy storage units 24A-24N (e.g., arrangeable as parts of an energy storage device 24). The RES-ESS facility 11 further includes at least one sensor 40, which may comprise one or more sky imaging sensors useful to determine sky conditions (such as the presence of clouds or lack thereof)

proximate to the RES-ESS facility 11, with output signals from the at least one sensor 40 being supplied to the RES-ESS dispatcher unit 36. The RES-ESS dispatcher unit 36 may also receive: (i) signals from one or more sensors 42 (e.g., satellite imaging sensors or the like) not necessarily associated with the RES-ESS facility 11; (ii) meteorological data provided by a meteorological modeling unit 44; (iii) signals from a forecasting unit 46 that may forecast generation by the renewable electrical energy generation device 14 and/or one or more other renewable electrical energy generation devices or units. In certain embodiments, time-dependent forecasting of electrical energy production may be performed by the forecasting unit 46 or may be performed by the RES-ESS dispatcher unit 36. In certain embodiments, a time-dependent forecast of electrical energy production may utilize one, two, or all three of the following: on-site sky imaging provided by the sensor(s) 40, satellite imaging provided by the sensor(s) 42, and meteorological data provided by the meteorological modeling unit 44. In certain embodiments, sensors of other types may be used.

Figure 2:
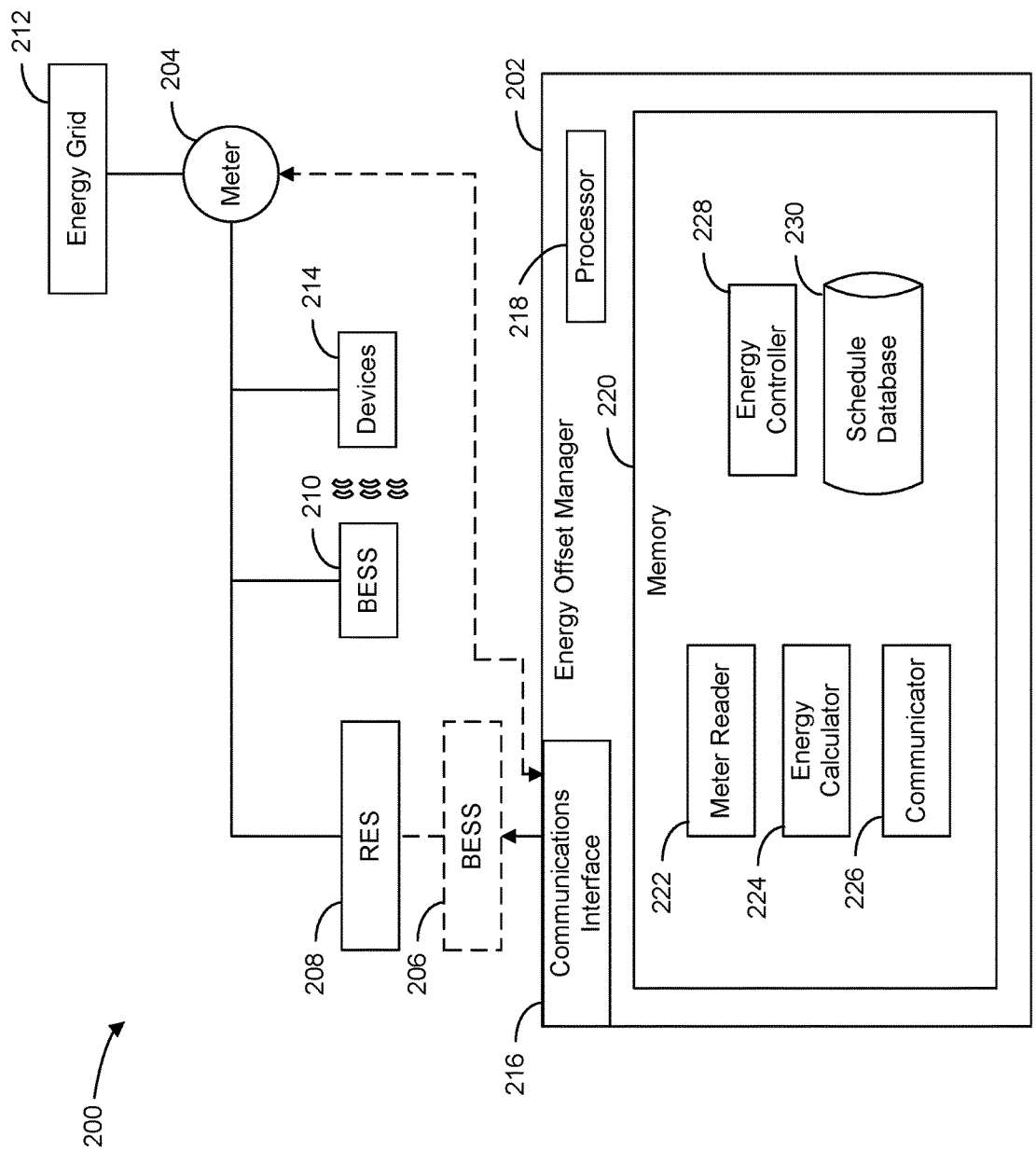
FIG. 2 illustrates a system including an energy offset management system connected to a renewable energy facility, according to some embodiments.

Referring now to FIG. 2, a system 200 for energy offset of parasitic losses is shown, in accordance with some embodiments of the present disclosure. As described herein, renewable energy facility and renewable energy power plant are used interchangeably. In brief overview, the system 200 can include an energy offset manager 202 that communicates with a meter 204, a battery energy storage system (BESS) 206, and/or a renewable energy source (RES) 208. These components may operate together as an auxiliary power source to offset parasitic, and any other, losses that occur in a BESS 210 of a renewable energy facility when the BESS 210 operates in a standby mode (e.g., not charging or discharging energy to an energy grid 212). For example, when the BESS 210 is operating in standby mode, there may be natural energy losses from the BESS such as energy leakage and/or parasitic losses of energy from a transformer of the BESS 210. Because of these losses, the BESS 210 may not be able to satisfy the energy requirements of devices 214 (e.g., heating, ventilation, and/or air equipment) operating within the same renewable energy facility. The energy offset manager 202 may control the BESS 206 and/or the RES 208 to compensate for the natural losses of the BESS 210 and ensure the energy requirements of the devices 214 are satisfied. The system 200 may include more, fewer, or different components than shown in FIG. 2. For example, there may be any number of client devices or computers that make up or are a part of the energy offset manager 202 or networks in the system 200.

The meter 204 may be or include a load energy meter (described herein as energy meter or meter) that is configured to read the amount of energy that is provided from the BESS 210 to the energy grid 212 and the amount the energy grid 212 provides back through the meter 204. The meter 204 may generate positive readings when energy is flowing to the energy grid 212 and negative values when the meter 204 reads energy flowing from the energy grid, or vice versa. The meter 204 may be similar to or the same as the ESS electrical power meter 29, shown and described with reference to FIG. 1A.

The BESS 210 may be a battery energy storage within the renewable energy facility. The BESS 210 may charge and/or discharge according to a charge/discharge schedule. The BESS 210 may be charged with energy from the energy grid 212 and/or renewable energy sources within the renewable energy facility. The BESS 210 may also operate to provide energy to the energy grid 212. The BESS 210 may store energy in energy storage units (e.g., energy storage units 24, shown and described with reference to FIGS. 1A and 1B). The BESS 210 may include one or more inverters and/or transformers to enable the BESS 210 to provide energy to the energy grid 212 and/or to power the devices 214.

The devices 214 may be or include one or more devices that operate within the renewable energy facility. For example, the devices 214 may include heating, ventilation, or air equipment that operates to maintain a temperature setpoint of the renewable energy facility and/or the BESS 210. The devices 214 may additionally or instead include lights or any other machinery or devices that are connected to an electrical circuit within the renewable energy facility.

The energy offset manager 202 can include or execute on one or more processors or computing devices and/or communicate via a network. The network can include computer networks such as the Internet, local, wide, metro, or other area networks, intranets, satellite networks, and other communication networks such as voice or data mobile telephone networks. The network can be used to access information resources such as web pages, websites, domain names, or uniform resource locators that can be presented, output, rendered, or displayed on at least one computing device, such as a laptop, desktop, tablet, personal digital assistant, smartphone, portable computers, or speaker.

The energy offset manager 202 can include or utilize at least one processing unit or other logic device such as a programmable logic array engine or a module configured to communicate with one another or other resources or databases. The components of the energy offset manager 202 can be separate components or a single component. The system 200 and its components can include hardware elements, such as one or more processors, logic devices, or circuits.

The energy offset manager 202 may comprise one or more processors that are configured to control charging and/or discharging of the BESS 206 and/or the RES 208 to provide energy to the devices 214. The energy offset manager 202 may comprise a communications interface 216, a processor 218, and/or memory 220. The energy offset manager 202 may communicate with the meter 204, the BESS 206, and/or the RES 208, via the communications interface 216 and/or the communicator 226 (e.g., an application programming interface (API)). The processor 218 may be or include an ASIC, one or more FPGAs, a DSP, circuits containing one or more processing components, circuitry for supporting a microprocessor, a group of processing components, or other suitable electronic processing components. In some embodiments, the processor 218 may execute computer code or modules (e.g., executable code, object code, source code, script code, machine code, etc.) stored in the memory 220 to facilitate the activities described herein. The memory 220 may be any volatile or non-volatile computer-readable storage medium capable of storing data or computer code.

The memory 220 may include a meter reader 222, an energy calculator 224, the communicator 226, an energy controller 228, and a schedule database 230. In brief overview, the components 222-230 may cooperate to offset energy losses that occur at the BESS 210 to ensure the power requirements of the devices 214 are satisfied. The components 222-230 may determine a time period in which the BESS 210 is not charging or discharging energy to the energy grid 212 by reading the meter 204. Upon making such a determination, the components 222-230 may identify an amount of energy the devices 214 needs for the energy requirements of the device to be satisfied. The components 222-230 may do so by identifying the amount from a reading of the meter 204. The components 222-230 may then direct the identified amount from one or both of the BESS 206 or the RES 208 to satisfy the energy requirements of the devices 214.

The meter reader 222 may comprise programmable instructions that, upon execution, cause the processor 218 to read or measure values from the meter 204. The meter reader 222 may measure energy provided to or from the energy grid 212 by reading values from the meter 204. The meter reader 222 may measure the energy provided to or from the energy grid 212 by polling a meter 204 connected (e.g., connected in series) between the energy grid 212 and the BESS 210 and/or devices 214 operating within the renewable energy facility. The meter reader 222 may transmit a signal to the meter 204 requesting a value that indicates the amount of energy that is being delivered to or from the energy grid 212. The meter 204 may receive the signal, measure the energy flowing across the meter 204 as a value, and transmit the value back to the meter reader 222.

The energy calculator 224 may comprise programmable instructions that, upon execution, cause the processor 218 to calculate the amount of energy to direct from the BESS 206 and/or the RES 208 to satisfy the energy requirements of the devices 214. The energy calculator 224 may determine if a BESS 210 operating within the renewable energy facility is charging or discharging energy to the energy grid 212. In some embodiments, the energy calculator 224 may do so by determining if the measured value (e.g., an absolute value of the measured value) from the meter 204 is below a threshold value. The energy calculator 224 may compare the value to the threshold and determine the BESS 210 is not charging or discharging if the value is below the threshold value. In some embodiments, the energy calculator 224 may determine if the BESS 210 is charging or discharging based on a charging/discharging schedule. The energy calculator 224 may retrieve such a charging/discharging schedule from the schedule database 230 (e.g., a relational database containing charging/discharging schedules of the BESS 210 for different time periods). For example, the energy calculator 224 may maintain an internal clock. The energy calculator 224 may read the internal clock to determine the current time. The energy calculator 224 may compare the current time to a charging/discharging schedule either stored locally in schedule database 230 or retrieved from a controller controlling the BESS 210 to determine if the BESS 210 is currently charging or discharging. In this way, the energy calculator 224 may determine if the BESS 210 is currently charging or discharging.

If the energy calculator 224 determines the BESS 210 is not charging or discharging the energy calculator 224 may determine if the energy requirements of devices operating within the renewable energy facility are satisfied by the BESS 210. The devices 214 may be or include one or more devices of the renewable energy facility that operate within the renewable energy facility. Examples of devices may include heating, ventilation, and air conditioning equipment, lighting equipment, and/or any other devices operating within the renewable energy facility. Such devices may be powered by the BESS 210 and, when the BESS 210 does not provide enough energy to the devices 214, by energy from the energy grid 212.

The energy calculator 224 may determine if the energy requirements of devices operating within the renewable energy facility are satisfied by identifying the value the energy calculator 224 measured from the meter 204. If the value is not zero, the energy calculator 224 may determine the BESS 210 is not providing enough energy to power the devices 214. Instead, the energy calculator 224 may determine the devices 214 are pulling energy from the energy grid 212, which is what the reading from the meter 204 may indicate. In some embodiments, to account for transient energy and/or other readings by the meter 204, the energy calculator 224 may implement a second threshold. The energy calculator 224 may compare the value read from the meter 204 to the second threshold. The energy calculator 224 may determine the energy requirements of the devices 214 within the renewable energy facility are not met in response to determining the value exceeds the second threshold.

If the energy calculator 224 determines the energy requirements of devices 214 operating within the renewable energy facility are not being met, the energy calculator 224 may identify a value indicating the amount of energy the devices 214 need for the devices' 214 energy requirements to be satisfied. The energy calculator 224 may do so by identifying the value the energy calculator 224 measured from the meter 204. In some embodiments, to account for transience and/or for imperfect meter readings, the energy calculator 224 may subtract a defined value (e.g., a buffer) from the value measured from the meter 204. In some embodiments, the defined value may be the second threshold used to determine whether the devices' 214 energy requirements are being satisfied by energy from the BESS 210, as described above. The energy calculator 224 may identify the subtracted value as the amount of energy that is needed to satisfy the energy requirements of the devices 214 within the renewable energy facility.

The energy calculator 224 may identify an amount of energy that is available from the RES 208. The energy calculator 224 may query the RES 208 for data that indicates how much energy the RES 208 has generated and/or stored. In some embodiments, the energy calculator 224 may maintain a database and continuously retrieve how much energy the RES 208 has generated and/or stored. In some embodiments, the energy calculator 224 may calculate and/or maintain a forecast of the amount of energy the RES 208 may generate or have stored based on different types of data (e.g., weather forecasts when the RES 208 includes one or more solar panels). In such embodiments, the energy calculator 224 may identify the amount of energy the RES 208 has generated or has stored from the forecast.

The energy calculator 224 may determine if the RES 208 has enough available energy to satisfy the energy requirements of the devices 214 in the renewable energy facility. The energy calculator 224 may compare the identified amount of energy the RES 208 has available with the value the energy calculator 224 identified from the meter 204. If the amount of energy the RES 208 has available is equal to or exceeds the value identified from the meter 204, the energy calculator 224 may determine the RES 208 has generated or is generating enough energy to satisfy the energy requirements of the devices 214 in tandem with energy the BESS 210 is providing the devices 214. Accordingly, the energy controller 228 may direct an amount of energy equal to or a buffer amount above the value the energy calculator 224 identified from the meter 204 to satisfy the energy requirements of the devices 214.

If the energy calculator 224 determines the RES 208 has not or is not generating enough energy to satisfy the energy requirements of the devices 214, the energy controller 228 may discharge the BESS 206. The energy controller 228 may comprise programmable instructions that, upon execution, cause the processor 218 to direct energy from the BESS 206 and/or the RES 208 to the devices 214. The energy controller 228 may direct energy from the RES 208 to the BESS 206 when the RES 208 is not providing energy to the devices 214 of the renewable energy facility. The BESS 206 may store the energy from the RES 208. When the energy calculator 224 determines the RES 208 is not generating enough energy to satisfy the energy requirements of the devices 214 within the renewable energy facility, the energy controller 228 may calculate the amount of energy that is still needed to satisfy the energy requirements of the devices 214 by subtracting the amount of energy the RES 208 can provide from the amount of energy the devices 214 need for their energy requirements to be satisfied. The energy controller 228 may then discharge the calculated amount of energy (or the calculated amount with an added buffer) from the BESS 206 to the devices 214, thus ensuring the devices 214 are properly powered despite the BESS 210 of the renewable energy facility not storing enough energy. If the BESS 206 does not have enough energy, the energy controller 228 may retrieve the remaining energy that is needed from the energy grid 212.

In some embodiments, the energy controller 228 discharges energy from the BESS 206 in response to determining the RES 208 is operating in a time period in which the RES 208 does not generate energy (e.g., at night or during a cloudy day). The energy calculator 224 may determine the RES 208 is not generating energy based on an energy forecast and/or a weather forecast for the time period (e.g., by identifying an indication that the RES 208 is not generating energy during the time period from the energy forecast and/or by identifying a time period from the weather forecast indicating there will be an amount of sunlight below a threshold available to generate energy). Upon determining the RES 208 is not generating energy, the energy controller 228 may discharge the amount of energy that is needed to power the devices 214 within the renewable energy plant from the BESS 206 to ensure the devices 214 may maintain operation.

In some embodiments, the energy offset manager 202, the BESS 206, and/or the RES 208 may not be connected to the BESS 210 or the meter 204. Instead, the components 202, 206, and 208 may be connected to a renewable energy side of the renewable energy facility. The renewable energy side may contain legacy renewable energy sources and/or a meter that measures renewable energy that is provided from the renewable energy sources of the renewable energy facility to various loads and/or the energy grid 212. The devices 214 may be disconnected from the BESS 210 and the meter 204 and connected to receive power from the BESS 206 and/or the RES 208. In such embodiments, the BESS 206 and/or the RES 208 may be sized to power the devices 214 without any power from the energy grid 212 or the BESS 210, thus avoiding causing an extra load on the energy grid 212 or the BESS 210.

For example, the energy offset manager 202 may direct energy from the RES 208 and/or the BESS 206 to the devices 214 operating within the renewable energy facility. The RES 208 may be configured to generate energy and charge the BESS 206 with the generated energy. The energy offset manager 202 may control the RES 208 and BESS 206 separately from any controller that controls other renewable energy sources of the renewable energy facility (e.g., a legacy controller and legacy renewable energy sources). Accordingly, the energy offset manager 202 in combination with the RES 208 and BESS 206 may operate as an "add-on" to legacy equipment at the renewable energy facility to ensure the devices 214 operating within the facility are sufficiently powered. The energy offset manager 202 may direct energy from the RES 208 and the BESS 206 to the devices 214 to power the devices 214 instead of relying on energy from the BESS 210, which may not always have enough energy available to power the devices 214 (e.g., such as because of parasitic losses, as described above).

The energy offset manager 202 may determine if the BESS 206 and the RES 208 are providing enough energy to satisfy the energy requirements of the devices 214. In some embodiments, the energy offset manager 202 may do so by communicating with a meter that reads the amount of energy the BESS 206 and/or the RES 208 provide to the devices 214 and comparing the read amount to a stored value in memory. In some embodiments, the energy offset manager 202 may do so by communicating with the devices 214 themselves and querying for a power reading from the devices 214. The energy offset manager 202 may determine if the devices 214 are receiving enough energy in any manner.

If the energy offset manager 202 determines the devices 214 are not receiving enough energy from the RES 208 and/or the BESS 206, the energy offset manager 202 may retrieve energy from a second RES (e.g., a legacy RES) of the renewable energy facility. The energy offset manager 202 may identify the amount of energy that is needed to satisfy the energy requirements of the devices 214 in addition to energy from the BESS 206 and/or the RES 208 (e.g., based on a difference between the energy requirements and the amount of energy the BESS 206 and/or the RES 208 are providing and/or based on a measured value the devices 214 or an energy meter provides indicating an amount of energy the devices 214 need). The energy offset manager 202 may establish a connection with the controller controlling the legacy renewable energy sources of the renewable energy plant and request the amount of energy the devices 214 need to operate and that the new BESS 206 and RES 208 are not capable of providing. Upon receiving the request, the new controller may direct energy to or through the same bus as the BESS 206 and RES 208. The energy offset manager 202 may direct the energy to the devices 214 to power the devices 214.

The energy offset manager 202 may determine if the energy from the legacy renewable energy sources, the new BESS 206, and the new RES 208 are supplying enough energy to satisfy the energy requirements of the devices 214. In some embodiments, the energy offset manager 202 may make this determination in a similar manner to how the energy offset manager 202 determined if the devices' 214 energy requirements were satisfied. In some embodiments, the energy offset manager 202 may do so after the controller transmits a message to the energy offset manager 202 indicating the legacy renewable energy sources are not generating enough energy or do not have enough energy stored to satisfy the remaining energy requirements of the devices 214.

Otherwise, if the energy offset manager 202 determines the devices 214 are not receiving enough energy from the RES 208, the BESS 206, and/or the legacy RES's, the energy offset manager 202 may retrieve energy from the energy grid 212. The energy offset manager 202 may identify the amount of energy that is needed to satisfy the energy requirements of the devices 214 in addition to energy from the BESS 206, the RES 208, and/or the legacy RES's (e.g., based on a difference between the energy requirements and the amount of energy the BESS 206 and/or the RES 208 are providing and/or based on a measured value the devices 214 or an energy meter provides indicating an amount of energy the devices 214 need). The energy offset manager 202 may transmit a signal to a utility controller controlling an energy grid 212 requesting the identified amount of energy that is needed to satisfy the energy requirements of the devices 214.

The utility controller may in turn direct energy through the BESS 206 and/or RES 208 to the devices 214 and, the energy offset manager 202 may direct the energy from the energy grid 212 to the devices 214.

Figure 3:
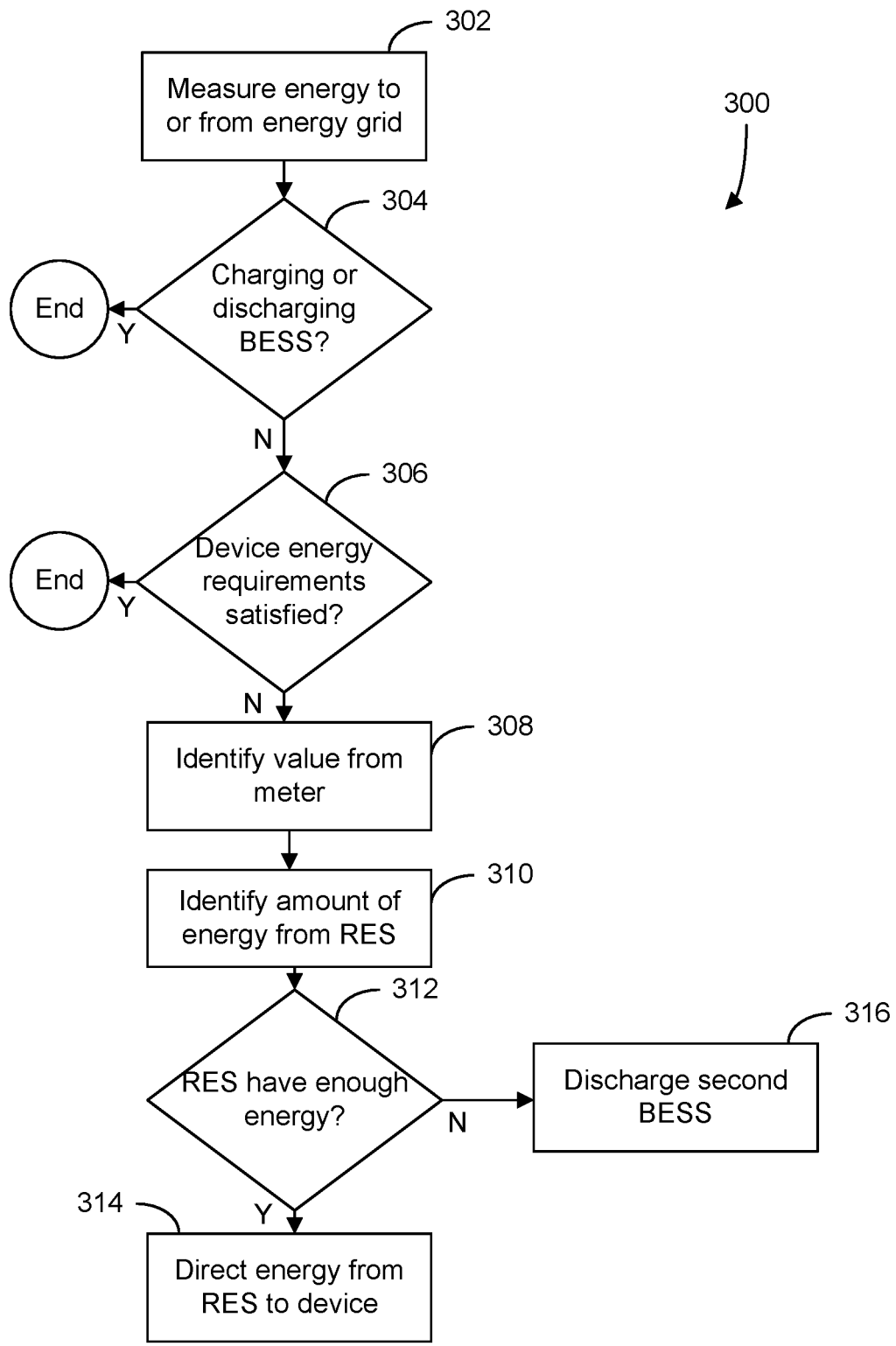
FIG. 3 illustrates a flowchart of an example method for offsetting parasitic energy losses of a battery energy storage system, according to some embodiments.

FIG. 3 illustrates a method 300 for offsetting parasitic energy losses of a battery energy storage system, according to some embodiments. The method 300 can be performed by a data processing system (e.g., a controller, the RES-ESS dispatcher unit 36, the ESS controller 22, the RES SCADA controller 12, the computer 900, the energy offset manager 202, etc.). In some embodiments, the data processing system is the controller of a renewable energy plant that contains a BESS. The data processing system may operate to offset the energy losses that naturally occur in a BESS or other devices of a renewable energy facility. The data processing system may do so to ensure devices operating within the facility may be sufficiently powered without requiring energy from an energy grid, even when the BESS providing energy to the devices is not able to provide enough energy to the devices. Performance of method 300 may enable the data processing system to operate "behind-the-meter" of a renewable energy facility, in some cases without directly communicating with any devices in the renewable energy facility itself, except for a load energy meter. Accordingly, performance of the method 300 may enable an operator to ensure devices within the renewable energy facility are sufficiently charged without significant setup or configuration changes to the facility itself. The method 300 may include more or fewer operations and the operations may be performed in any order.

At operation 302, the data processing system measures energy provided to or from an energy grid. The data processing system may measure the energy provided to or from the energy grid by polling an energy meter connected (e.g., connected in series) between the energy grid and a BESS and/or devices operating within a renewable energy facility. The data processing system may transmit a signal to the energy meter requesting a value that indicates the amount of energy that is being delivered to or from the energy grid. The energy meter may receive the signal, measure the energy flowing across the meter as a value, and transmit the value back to the data processing system. In some embodiments, the energy meter may transmit a positive value to the data processing system if the BESS is discharging energy to the grid and a negative value if the energy grid is providing energy to the BESS or devices within the renewable energy facility, or vice versa. In some embodiments, the BESS operating within the renewable energy facility may receive energy for charging across the energy meter from a renewable energy source (e.g., a legacy renewable energy source). In such embodiments, the measurements from the energy meter may correspond to or represent energy from the renewable energy source in addition to or instead of the energy grid.

At operation 304, the data processing system determines if a BESS operating within the renewable energy facility is charging or discharging energy to the energy grid or a renewable energy source (e.g., a legacy renewable energy source) within the renewable energy facility. In some embodiments, the data processing system may do so by determining if the measured value (e.g., an absolute value of the measured value) from the meter is below a threshold value. The data processing system may compare the value to the threshold and determine the BESS is not charging or discharging if the value is below the threshold value. In some embodiments, the data processing system may determine if the BESS is charging or discharging based on a charging/discharging schedule. For example, the data processing system may maintain an internal clock. The data processing system may read the internal clock to determine the current time. The data processing system may compare the current time to a charging/discharging schedule either stored locally in memory or retrieved from a controller controlling the BESS to determine if the BESS is currently charging or discharging. In this way, the data processing system may determine if the BESS is currently charging or discharging.

If the data processing system determines the BESS is currently charging or discharging, the data processing system may stop performing the method 300. However, if the data processing system determines the BESS is not charging or discharging, at operation 306, the data processing system determines if the energy requirements of devices operating within the renewable energy facility are satisfied by the BESS. The device may be or include one or more devices of the renewable energy facility that operate within the renewable energy facility. Examples of devices may include heating, ventilation, and air conditioning equipment, lighting equipment, and/or any other devices operating within the renewable energy facility. Such devices may be powered by the BESS and, when the BESS does not provide enough energy to the devices, by energy from the energy grid.

The data processing system may determine if the energy requirements of devices operating within the renewable energy facility are satisfied by identifying the value the data processing system measured from the energy meter in operation 302. If the value is not zero, the data processing system may determine the BESS is not providing enough energy to power the devices. Instead, the data processing system may determine devices are pulling energy from the energy grid, which is what the reading from the energy meter may indicate. In some embodiments, to account for transient energy and/or other readings by the meter, the data processing system may implement a second threshold. The data processing system may compare the value read from the meter to the second threshold. The data processing system may determine the energy requirements of the devices within the renewable energy facility are not met in response to determining the value exceeds the second threshold.

If the data processing system determines the energy requirements of the devices within the renewable energy facility are being met, the data processing system may stop performing method 300. However, if the data processing system determines the energy requirements of devices operating within the renewable energy facility are not being met, at operation 308, the data processing system may identify a value indicating the amount of energy the devices need for their energy requirements to be satisfied. The data processing system may do so by identifying the value the data processing system measured from the energy meter. In some embodiments, to account for transience and/or for imperfect energy meter readings, the data processing system may subtract a defined value (e.g., a buffer) from the value measured from the energy meter. In some embodiments, the defined value may be the second threshold used to determine whether the devices' energy requirements are being satisfied by energy from the BESS, as described above. The data processing system may identify the subtracted value as the amount of energy that is needed to satisfy the energy requirements of the devices within the renewable energy facility.

At operation 310, the data processing system identifies an amount of energy that is available from an RES. The RES may be one or more solar panels, windmills, or any other renewable energy source that generates energy and that is controlled by the data processing system. The data processing system may query the renewable energy source for data that indicates how much energy the RES has generated and/or stored. In some embodiments, the data processing system may maintain a database and continuously retrieve how much energy the RES has generated and/or stored. In some embodiments, the data processing system may calculate and/or maintain a forecast of the amount of energy the RES may generate or have stored based on different types of data (e.g., weather forecasts when the RES includes one or more solar panels). In such embodiments, the data processing system may identify the amount of energy the RES has generated or has stored from the forecast.

At operation 312, the data processing system determines if the RES has enough available energy to satisfy the energy requirements of the devices in the renewable energy facility. The data processing system may compare the identified amount of energy the RES has available with the value the data processing system identified from the energy meter. If the amount of energy the RES has available is equal to or exceeds the value identified from the energy meter, the data processing system may determine the RES has generated or is generating enough energy to satisfy the energy requirements of the devices in tandem with energy the BESS is providing the devices. Accordingly, at operation 314, the data processing system directs an amount of energy equal to or a buffer amount above the value the data processing system identified from the energy meter to satisfy the energy requirements of the devices.

If the data processing system determines the RES has not or is not generating enough energy to satisfy the energy requirements of the devices, at operation 316, the data processing system discharges a second BESS. The second BESS may be a BESS that is coupled to the RES and that is charged with energy generated by the RES. The data processing system may direct energy from the RES to the second BESS when the RES is not providing energy to the devices of the renewable energy facility. The second BESS may store the energy from the RES. When the data processing system determines the RES is not generating enough energy to satisfy the energy requirements of the devices within the renewable energy facility, the data processing system may calculate the amount of energy that is still needed to satisfy the energy requirements of the devices by subtracting the amount of energy the RES can provide from the amount of energy the devices need for their energy requirements to be satisfied. The data processing system may then discharge the calculated amount of energy (or the calculated amount with an added buffer) from the second BESS to the devices, thus ensuring the devices are properly powered despite the BESS of the renewable energy facility not storing enough energy. If the second BESS does not have enough energy, the data processing system may retrieve the remaining energy that is needed from the grid.

In some embodiments, the data processing system discharges energy from the BESS in response to determining the RES is operating in a time period in which the RES does not generate energy (e.g., at night or during a cloudy day). The data processing system may determine the RES is not generating energy based on an energy forecast and/or a weather forecast for the time period (e.g., by identifying an indication that the RES is not generating energy during the time period from the energy forecast and/or by identifying a time period from the weather forecast indicating there will be an amount of sunlight below a threshold available to generate energy). Upon determining the RES is not generating energy, the data processing system may discharge the amount of energy that is needed to power the devices within the renewable energy plant from the second BESS to ensure the devices may maintain operation.

In some embodiments, the data processing system may continuously monitor the energy meter as the RES and/or the second BESS are supplying energy to the devices. The data processing system may do so because the energy requirements of the devices within the renewable energy facility may fluctuate over time. The data processing system may repeat the method 300 as the data processing system identifies new values measured by the energy meter and adjusts the amount of energy the RES and the second BESS provide the devices, thus enabling the devices to operate as their energy requirements change.

For example, after directing energy from the RES or the BESS to the devices within the renewable energy facility, the data processing system may measure the energy meter to determine if enough energy is being directed to the devices. The directed amount of energy may not be enough because of a fluctuation in the energy requirements of the devices and/or because of increased parasitic losses at one or more transformers of the BESS that reduce the amount of energy the BESS can provide the devices while in an idle state. The data processing system may identify the value from the meter and direct energy equal to (or with a defined buffer to account for unintended losses) to the devices from the RES and/or the BESS to ensure the devices can remain sufficiently powered to operate.

In some embodiments, instead of determining how much energy to deliver to the devices within the renewable energy facility, the data processing system may increase (or decrease) the energy from the RES and/or the second BESS until the load energy meter reaches zero or a defined threshold. For example, upon determining the devices energy requirements are not satisfied from a measurement of the meter, the data processing system may begin discharging energy to the devices from the RES and/or the second BESS. As the data processing system is doing so, the data processing system may monitor or continuously measure values from the meter. The data processing system can increase the energy being discharged from the RES and/or the second BESS until the value reaches a threshold (e.g., a defined threshold) or zero. Upon determining or receiving a value equal to the threshold or zero, the data processing system may stop increasing the amount of energy being discharged or stop discharging the energy altogether. In this way, the data processing system can power the devices within the renewable energy facility without calculating the amount of energy that is needed to do so.

Figure 4:
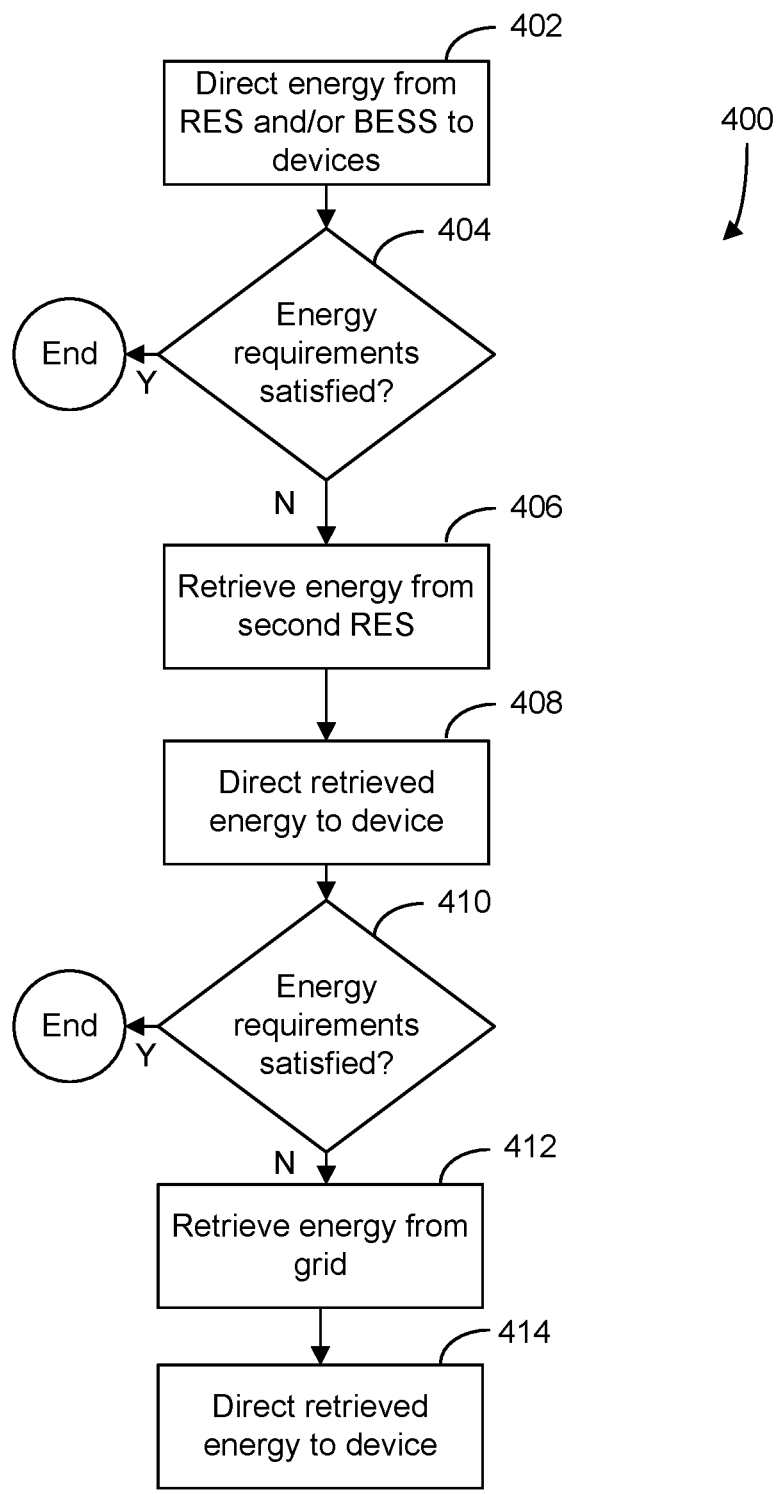
FIG. 4 illustrates a flowchart for powering devices within a renewable energy power plant, according to some embodiments.

FIG. 4 illustrates a method 400 for powering devices within a renewable energy power plant, according to some embodiments. The method 400 can be performed by a data processing system (e.g., a controller, the RES-ESS dispatcher unit 36, the ESS controller 22, the RES SCADA controller 12, the computer 900, the energy offset manager 202, etc.). In some embodiments, the data processing system is the controller of a renewable energy plant that contains a BESS. The data processing system may operate to power devices within a renewable energy power plant using energy from a renewable energy source and/or a BESS charged by the renewable energy source. The data processing system may provide enough energy to power the devices of the renewable energy facility from the RES and/or the BESS. If the RES and/or the BESS do not have enough energy stored, the data processing system may direct energy from other renewable energy sources of the renewable energy facility to the devices. If the renewable energy sources do not have enough power, the data processing system may retrieve energy from an energy grid to power the devices. In this way, the data processing system may enable renewable energy sources to power devices operating within a renewable energy facility without relying on any energy from a BESS stored within the renewable energy facility. The method 400 may include more or fewer operations and the operations may be performed in any order.

At operation 402, the data processing system directs energy from an RES and/or a BESS to devices operating within a renewable energy facility. The devices may be any type of devices that operate within the renewable energy facility, as are described above. The RES may be configured to generate energy and charge the BESS with the generated energy. The RES and BESS may be connected to a "renewable energy" side of the renewable energy facility that provides energy to and receives energy from an energy grid through an energy meter that is specific to the renewable energy sources (e.g., a meter that does not measure the energy the energy grid provides to a BESS of the renewable energy facility). The data processing system may control the RES and BESS separately from any controller that controls other renewable energy sources of the renewable energy facility (e.g., a legacy controller and legacy renewable energy sources). Accordingly, the data processing system in combination with the RES and BESS may operate as an "add-on" to legacy equipment at the renewable energy facility to ensure the devices operating within the facility are sufficiently powered. The data processing system may direct energy from the RES and the BESS to the devices to power the devices instead of relying on energy from a legacy BESS, which may not always have enough energy available to power the devices (e.g., such as because of parasitic losses, as described above).

At operation 404, the data processing system determines if the BESS and the RES are providing enough energy to satisfy the energy requirements of the devices. In some embodiments, the data processing system may do so by communicating with a meter that reads the amount of energy the BESS and/or the RES provide to the devices and comparing the read amount to a stored value in memory. In some embodiments, the data processing system may do so by communicating with the devices themselves and querying for a power reading from the devices. The data processing system may determine if the devices are receiving enough energy in any manner. If the data processing system determines the devices are receiving enough energy from the RES and/or the BESS, the data processing system may stop performing the method 400.

Otherwise, if the data processing system determines the devices are not receiving enough energy from the RES and/or the BESS, at operation 406, the data processing system retrieves energy from a second RES (e.g., a legacy RES) of the renewable energy facility. The data processing system may identify the amount of energy that is needed to satisfy the energy requirements of the devices in addition to energy from the BESS and/or the RES (e.g., based on a difference between the energy requirements and the amount of energy the BESS and/or the RES are providing and/or based on a measured value the devices or an energy meter provides indicating an amount of energy the devices need). The data processing system may establish a connection with the controller controlling the legacy renewable energy sources of the renewable energy plant and request the amount of energy the devices need to operate and that the new BESS and RES are not capable of providing. Upon receiving the request, the new controller may direct energy to or through the same bus as the BESS and RES. At operation 408, the data processing system may direct the energy to the devices to power the devices.

At operation 410, the data processing system determines if the energy from the legacy renewable energy sources, the new BESS, and the new RES are supplying enough energy to satisfy the energy requirements of the devices. In some embodiments, the data processing system may make this determination in a similar manner to how the data processing system determined if the devices' energy requirements were satisfied at operation 404. In some embodiments, the data processing system may do so after the controller transmits a message to the data processing system indicating the legacy renewable energy sources are not generating enough energy or do not have enough energy stored to satisfy the remaining energy requirements of the devices. If the data processing system determines the energy requirements of the devices are satisfied, the data processing system may stop performing the method 400.

Otherwise, if the data processing system determines the devices are not receiving enough energy from the RES, the BESS, and/or the legacy RES's, at operation 412, the data processing system retrieves energy from the energy grid. The data processing system may identify the amount of energy that is needed to satisfy the energy requirements of the devices in addition to energy from the BESS, the RES, and/or the legacy RES's (e.g., based on a difference between the energy requirements and the amount of energy the BESS and/or the RES are providing and/or based on a measured value the devices or an energy meter provides indicating an amount of energy the devices need). The data processing system may transmit a signal to a utility controller controlling an energy grid requesting the identified amount of energy that is needed to satisfy the energy requirements of the devices. The utility controller may in turn direct energy through the BESS and/or RES to the devices and, at operation 414, the data processing system directs the energy from the grid to the devices.

In some embodiments, the data processing system discharges energy from the legacy RESs upon determining the RES is charging (e.g., currently charging) the BESS. For example, the data processing system may direct the RES to charge the BESS. The RES and the BESS may not be able to power the devices while the RES charges the BESS. In such cases, the data processing system may retrieve and direct energy from the legacy RESs to power the devices. The data processing system stop retrieving and directing energy from the legacy RESs and resume directing energy from the RES and BESS upon the BESS being sufficiently charged (e.g., responsive to determining the BESS is charged to a defined threshold).

Advantageously, by connecting a new RES, BESS, and/or controller between devices operating within a renewable energy facility and renewable energy sources already connected to the facility, the data processing system may power the devices without relying on any energy from the BESS that is within the facility and is susceptible to parasitic losses. Instead, the RES, BESS, and controller may operate as a self-containing energy source that can power the devices alone or communicate with legacy equipment and/or, if necessary, the energy grid to provide energy to the devices. This configuration may enable the devices to be sufficiently powered using renewable energy as the main source of energy and energy from the energy grid only in certain situations. Accordingly, less energy may be required from the energy grid, enabling the grid to provide energy to other loads, thus reducing the peak load requirements of the energy grid and increasing the availability of energy on the grid.

Figure 5:
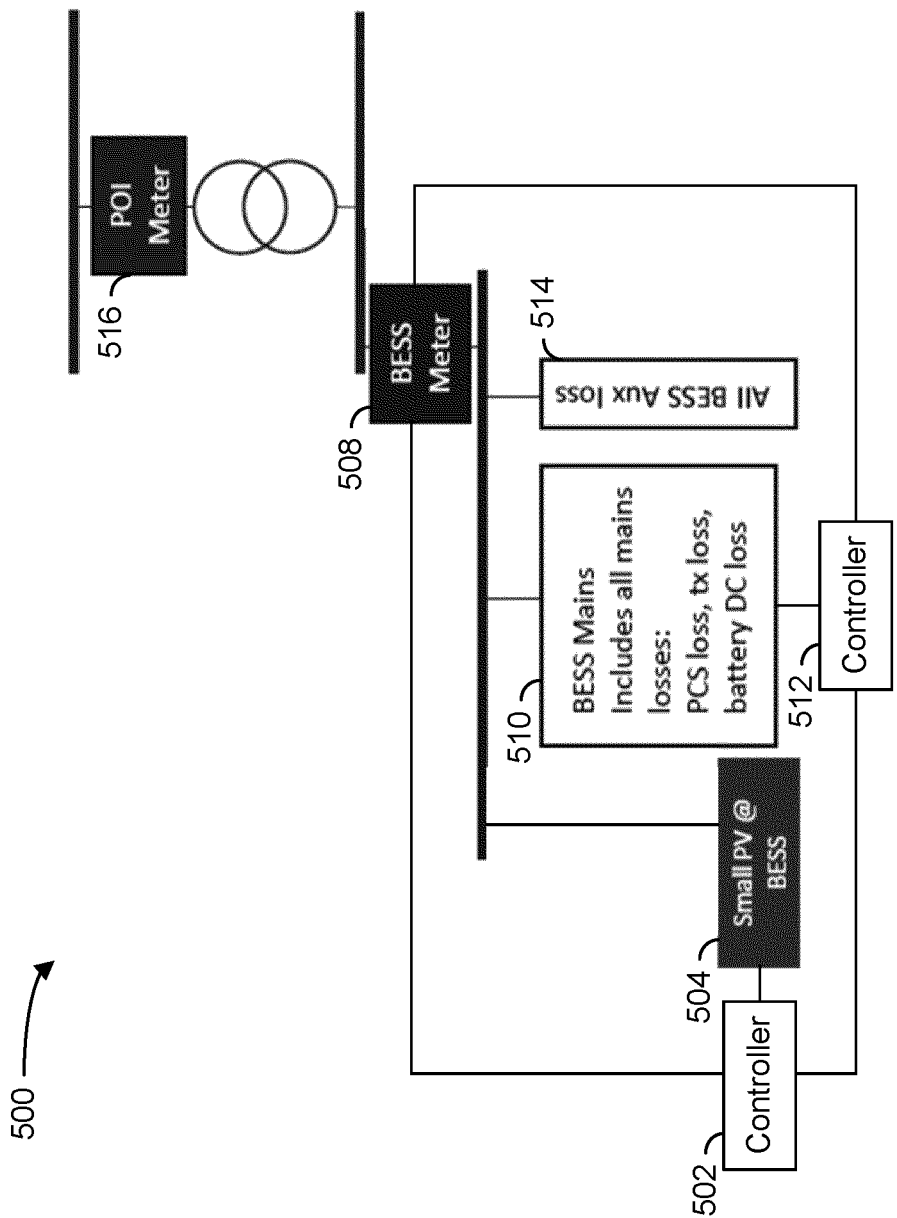
FIG. 5 illustrates an example system including an energy offset management system connected to a renewable energy facility, according to some embodiments.

FIG. 5 illustrates an example energy offset management system 500, according to some embodiments. The energy offset management system 500 may include a controller 502 that communicates with a renewable source of energy and BESS 504 as an add-on to a legacy infrastructure 506 of a renewable energy facility. The legacy infrastructure 506 may include a BESS meter 508, a BESS 510, a controller 512 controlling the BESS 510, and devices 514. A point of interconnection (POI) meter 516 may read how much energy travels to and from an energy grid. The controller 502 may measure the energy that travels to and from the energy grid by reading a value generated by the BESS meter 508.

The controller 502 may control the renewable source of energy and BESS 504 to power the devices 514 in combination with the BESS 510. In doing so, the controller 502 may provide energy to the devices 514 that the BESS 510 may lose naturally, such as parasitic losses. In some embodiments, to reduce the cost or size requirements of the added controller 502 and renewable source of energy and BESS 504, the BESS of the renewable source of energy and BESS 504 may be smaller than the BESS 510 (e.g., about 2-3% the size of the BESS 510). The controller 502 may determine when the BESS 510 is not charging or discharging energy to the energy grid based on the measured value from the BESS meter (e.g., by determining the measured value exceeds a threshold). The controller 502 may then identify the value as the amount of energy the devices 514 need to operate (e.g., the amount of energy the devices 514 are currently pulling from the energy grid). The controller 502 may control (e.g., discharge or direct energy from) the renewable source of energy and BESS 504 to provide the amount of energy to the devices 514.

In some embodiments, instead of or in addition to charging the devices 514, the controller 502 may power the BESS 510. To do so, the controller 502 may establish a communication session with the controller 512 controlling the switches to control the charge and/or discharge of the BESS 510. The controller 512 may transmit a current state of charge and a maximum charge of the BESS 510 and/or a request for a defined amount of energy to the controller 502. The controller 502 may receive the request, determine an amount of energy to send the BESS 510 (e.g., subtract the current state of charge from the maximum charge or identify the requested amount of energy), and discharge the determined amount of energy from the renewable source of energy and BESS 504 to the BESS 510. The controller 502 may in turn enable the BESS 510 to receive the energy, such as by activating the switches to the charge ports of the BESS 510. In this way, the add-on controller 502 and renewable source of energy and BESS 504 may enable the BESS 510 to remain fully charged, despite any parasitic losses that may naturally occur.

Figure 6:
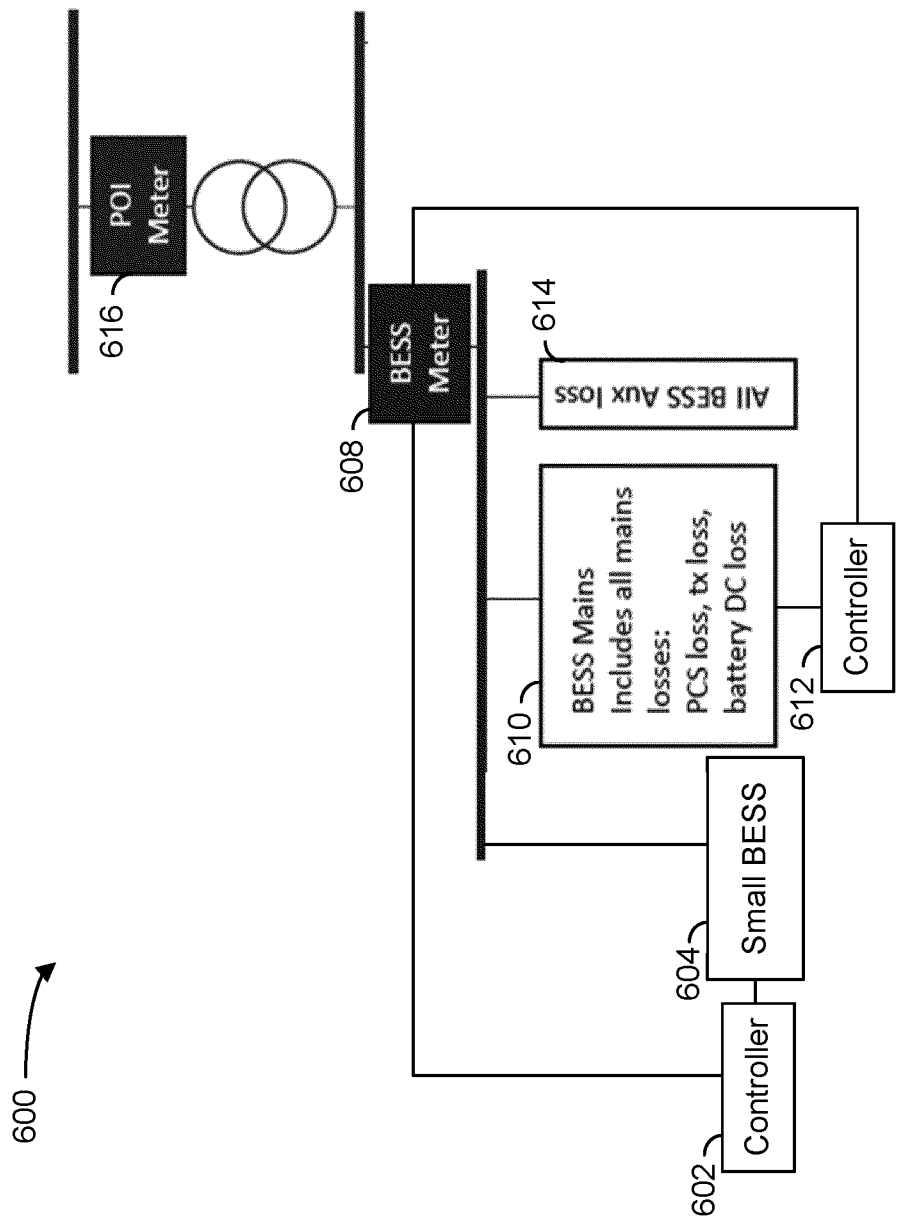
FIG. 6 illustrates another example system including an energy offset management system connected to a renewable energy facility, according to some embodiments.

FIG. 6 illustrates another example energy offset management system 600, according to some embodiments. The energy offset management system 600 may include a controller 602 that communicates with a BESS 604 as an add-on to a legacy infrastructure 606 of a renewable energy facility. The legacy infrastructure 606 may include a BESS meter 608, a BESS 610, a controller 612 controlling the BESS 610, and devices 614. A point of interconnection (POI) meter 616 may read how much energy travels to and from an energy grid. The controller 602 may measure the energy that travels to and from the energy grid by reading a value generated by the BESS meter 608. The components of the energy offset management system 600 may be similar to or the same as the components of the energy offset management system 500, shown and described with reference to FIG. 5.

The controller 602 may control the BESS 604 to power the devices 614 in combination with the BESS 610. In doing so, the controller 602 may provide energy to the devices 614 that the BESS 610 may lose naturally, such as parasitic losses. The controller 602 may do so operating similar to the controller 502, described above, by determining the amount of energy the devices 614 need to operate and sending the determined amount to the devices 614 from the BESS 604. Operation of the energy offset management system 600 may require minimal or no communication with the controller operating to control charging and discharging of the BESS 610.

Figure 7:
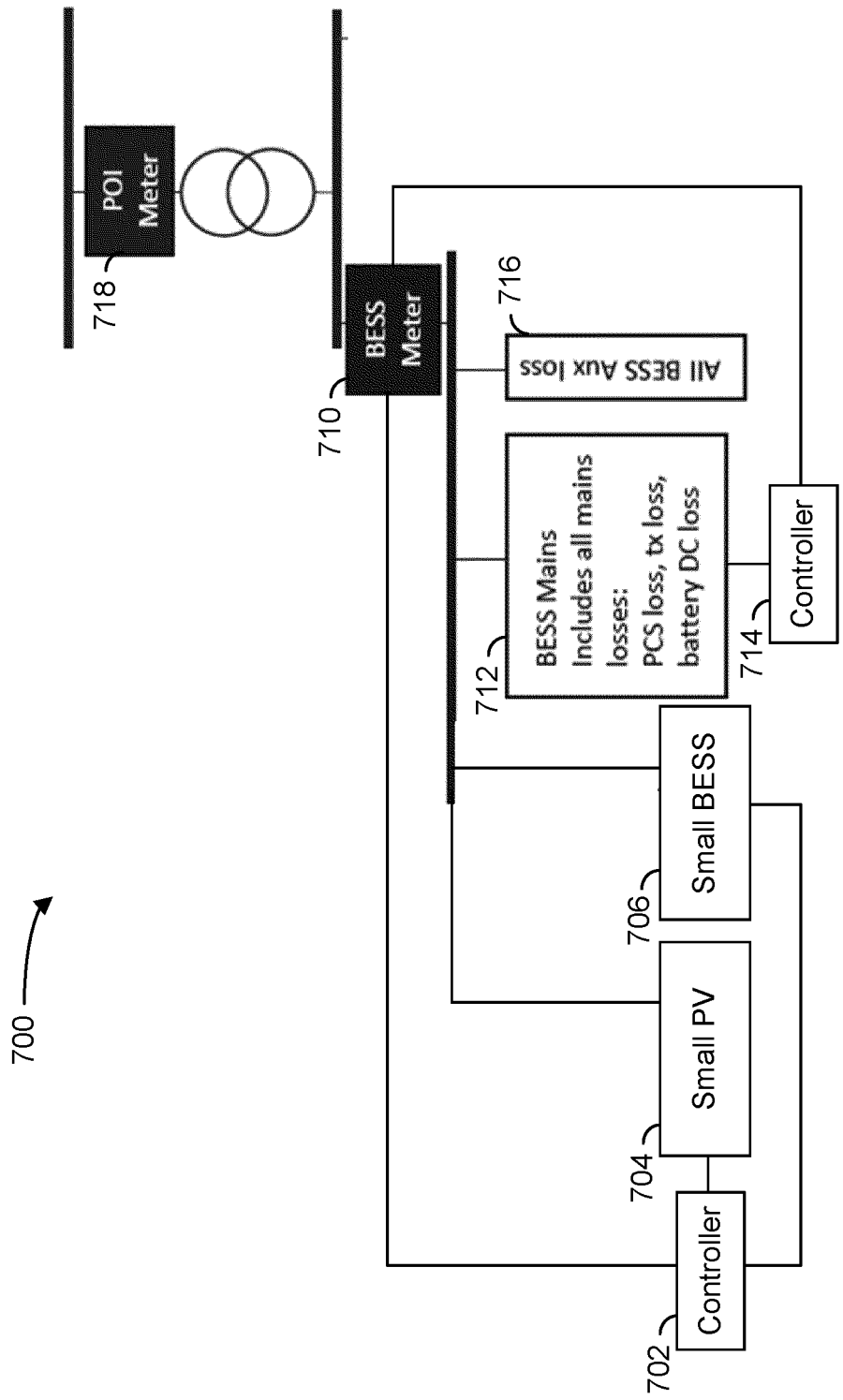
FIG. 7 illustrates another example system including an energy offset management system connected to a renewable energy facility, according to some embodiments.

FIG. 7 illustrates another example energy offset management system 700, according to some embodiments. The energy offset management system 700 may include a controller 702 that communicates with a BESS 706 and an RES 704 as an add-on to a legacy infrastructure 708 of a renewable energy facility. The legacy infrastructure 708 may include a BESS meter 710, a BESS 712, a controller 714 controlling the BESS 712, and devices 716. A point of interconnection (POI) meter 718 may read how much energy travels to and from an energy grid. The controller 702 may measure the energy that travels to and from the energy grid by reading a value generated by the BESS meter 710. The components of the energy offset management system 700 may be similar to or the same as the components of the energy offset management system 500, shown and described with reference to FIG. 5.

The controller 702 may direct energy from the BESS 706 and the RES 704 to the devices 716 without communicating with the controller 714 using the systems and methods described herein. The controller 702 may direct energy from the RES 704 and the BESS 706 individually or together (e.g., cause the RES 704 and the BESS 706 to discharge energy to the devices 716 one at a time or concurrently). The controller 702 can do so by changing the states of switches directing energy from the RES 704 and the BESS 706 using control signals. In doing so, the combination of the controller 702, the BESS 706, and the RES 704 may operate as an add-on that an operator can connect to the legacy infrastructure 708 without ensuring the components are compatible with each other (e.g., without ensuring the controller 702 can communicate with the controller 714). Instead, the controller 702, the BESS 706, and the RES 704 may offset any natural (e.g., parasitic) losses that occur at the BESS 712 communicating only with the BESS meter 710 and by generating and/or storing energy locally.

Figure 8:
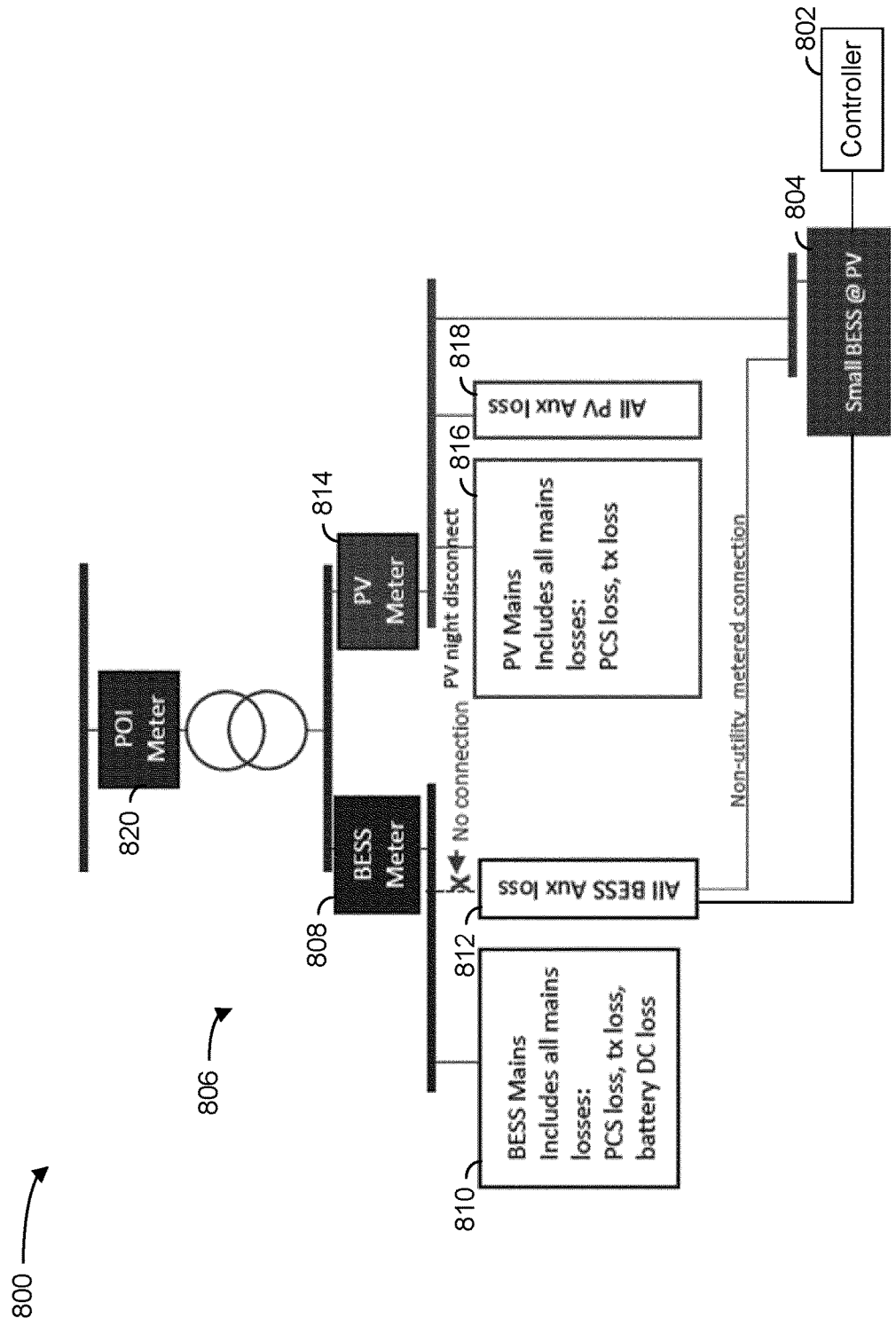
FIG. 8 illustrates an example device powering system, according to some embodiments.

FIG. 8 illustrates an example device powering system 800, according to some embodiments. The device powering system 800 may include a controller 802 that communicates with a renewable source of energy and BESS 804 as an add-on to a legacy infrastructure 806 of a renewable energy facility. The legacy infrastructure 806 may include a BESS meter 808, a BESS 810, devices 812, a photovoltaic (PV) meter 814, a PV energy source 816, and/or PV devices 818. A point of interconnection (POI) meter 820 may read how much energy travels to and from an energy grid. The controller 802 may measure the energy requirements of the devices 812 by communicating with the devices 812 and/or by reading a meter connected to the devices 812 that indicates the real-time energy requirements of the devices 812. Components of the device powering system 800 may be similar to or the same as corresponding components of the energy offset management system 500, shown and described with reference to FIG. 5.

The controller 802 may control the renewable source of energy and BESS 804 to power the devices 812 instead of the BESS 810. The controller 802 may do so, for example, after the devices 812 are disconnected (e.g., after a user disconnects the devices 812) from a bus electrically connecting the devices 812 with the BESS 810 and/or the BESS meter 808. The controller 802 may do so by measuring the energy requirements of the devices 812 either by receiving the requirements from the devices 812 themselves or by reading the energy requirements from a meter measuring the energy requirements. In some cases, the energy requirements may be stored in memory of the controller 802. The controller 802 may read the energy requirements and then direct energy from the renewable source of energy and BESS 804 that is equal to the read requirements. In some cases, the controller 802 may determine there is not enough energy available from the renewable source of energy and BESS 804. In such cases, the controller 802 may communicate with a controller controlling the PV energy source 816 requesting the remaining needed energy. The controller 802 may retrieve the energy and then direct the retrieved energy to the devices 812. In some cases, the controller controlling the PV energy source 816 may respond to the controller 802 indicating there is not any or enough energy available. In such cases, the controller 802 may direct the energy that is available from the PV energy source 816 to the devices 812 and/or request the remaining energy that is needed to satisfy the energy requirements of the devices 812 from a computer operating the energy grid. The controller 802 may retrieve the remaining energy from the energy grid and direct the energy to the devices 812 to satisfy the energy requirements of the devices 812. In this way, the controller 802 may operate as an add-on to avoid powering devices in a renewable energy facility with energy from a BESS of the facility that is meant to charge or discharge to the energy grid.

The example device powering system 800 has a few technical advantages. For example, by using a secondary BES and/or RES to power the equipment within the renewable energy facility, the legacy BESS (e.g., the BESS that operates to charge and/or discharge energy to the energy grid) may be sized smaller, therefore saving resources and storage area in the facility. Another advantage is that even if the new RES and/or secondary BESS are not able to provide power to the devices, energy from other RES's of the facility and/or the energy grid may be called up on to power the devices, enabling the devices to maintain operation. Additionally, the new BESS, RES, and/or controller may be implemented without affecting operation of the BESS, enabling quick set up and configuration of the secondary BESS, RES, and/or controller with little risk to the overall health of the equipment in the facility.

Computing Environment

Having discussed specific embodiments of the present solution, it may be helpful to describe aspects of the operating environment as well as associated system components (e.g., hardware elements) in connection with the methods and systems described herein.

Figure 9A:
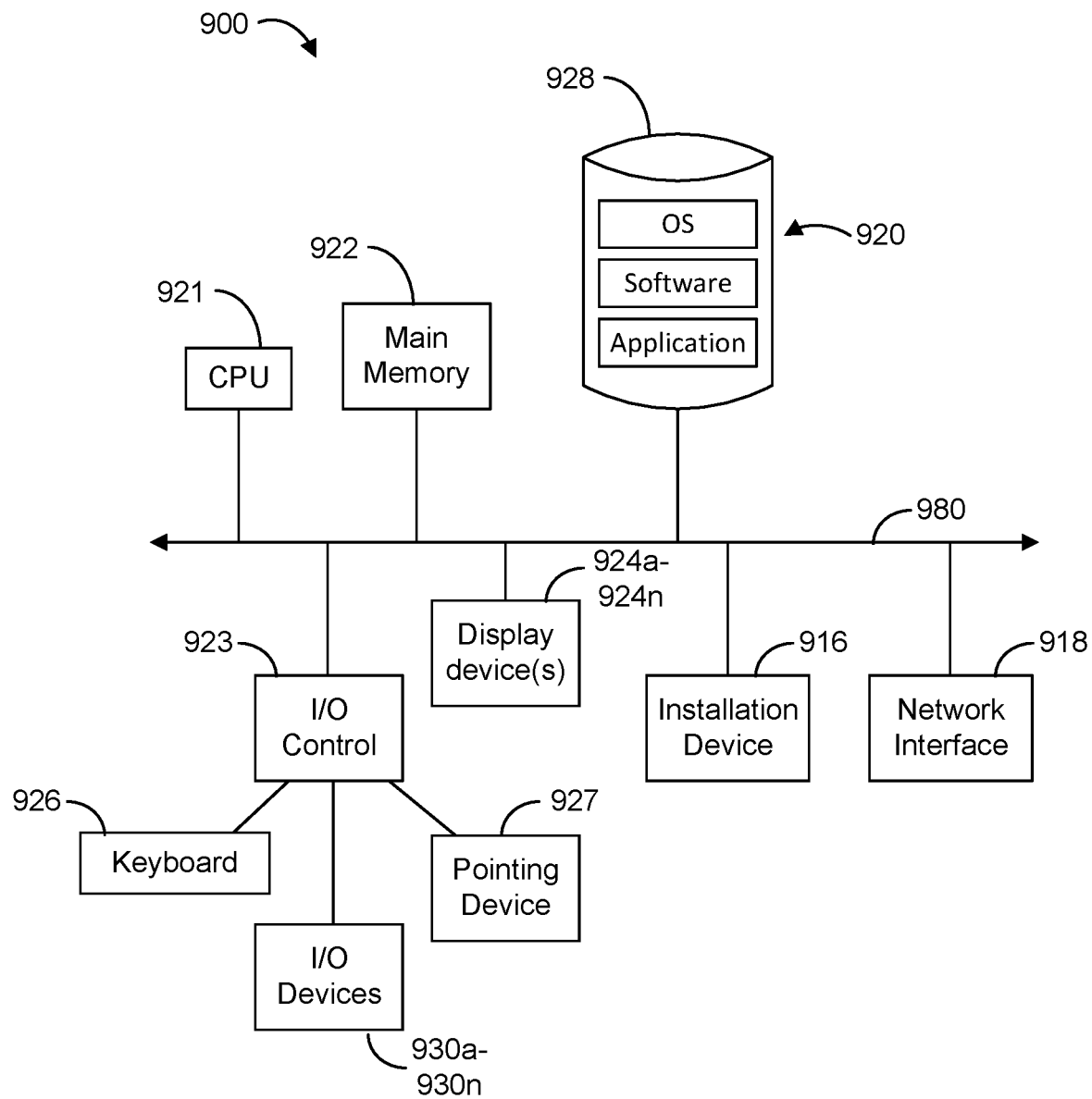
FIGS. 9A and 9B are block diagrams depicting embodiments of computing devices useful in connection with the methods and systems described herein.
Figure 9B:
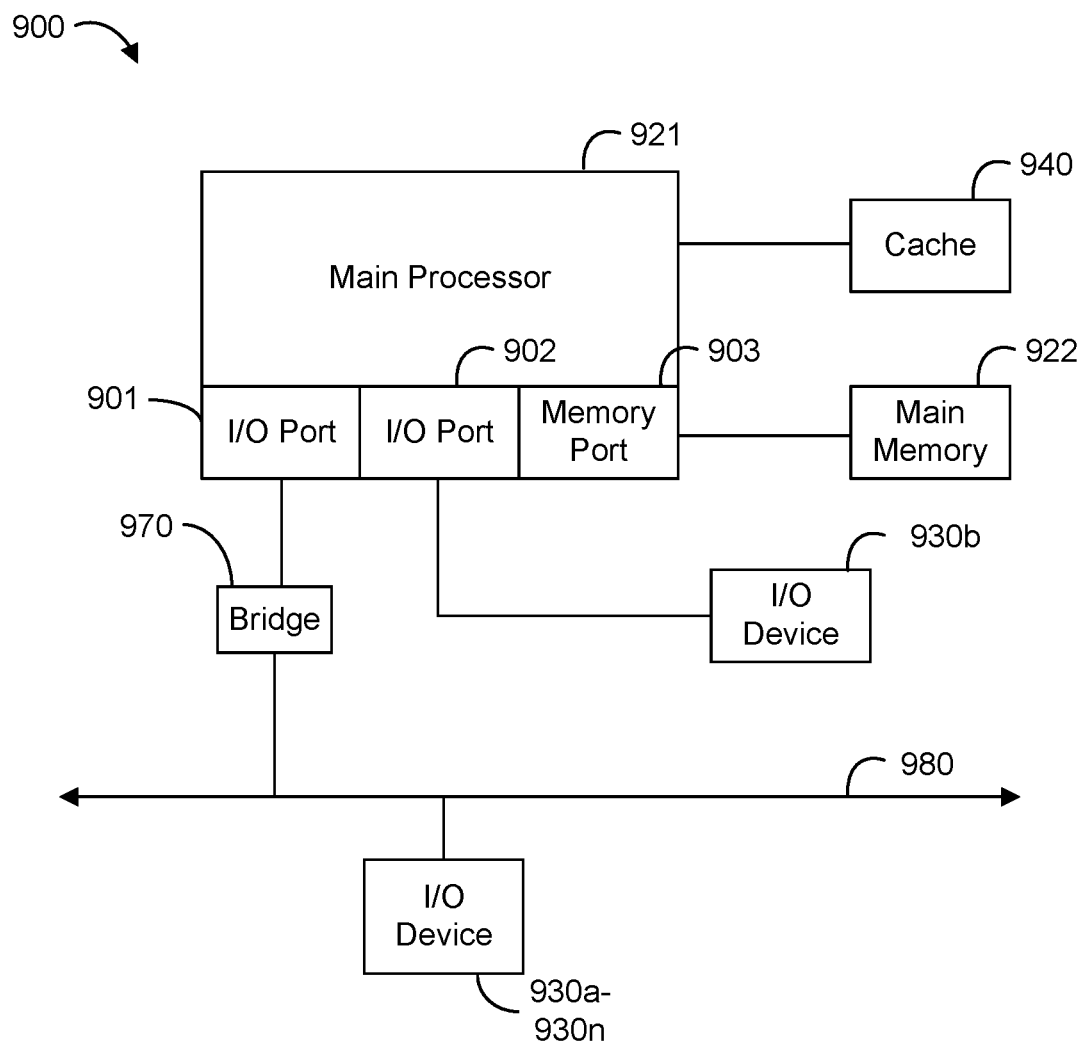

The systems discussed herein may be deployed as and/or executed on any type and form of computing device, such as a computer, network device or appliance capable of communicating on any type and form of network and performing the operations described herein. FIGS. 9A and 9B depict block diagrams of a computing device 900 useful for practicing an embodiment of the systems and methods described herein. As shown in FIGS. 9A and 9B, each computing device 900 includes a central processing unit 921, and a main memory unit 922. As shown in FIG. 9A, a computing device 900 may include a storage device 928, an installation device 916, a network interface 918, an I/O controller 923, display devices 924a-924n, a keyboard 926 and a pointing device 927, such as a mouse. The storage device 928 may include, without limitation, an operating system and/or software. As shown in FIG. 9B, each computing device 900 may also include additional optional elements, such as a memory port 903, a bridge 970, one or more input/output devices 930a-930n (generally referred to using reference numeral 930), and a cache memory 940 in communication with the central processing unit 921.

The central processing unit 921 is any logic circuitry that responds to and processes instructions fetched from the main memory unit 922. In many embodiments, the central processing unit 921 is provided by a microprocessor unit, such as: those manufactured by Intel Corporation of Mountain View, California; those manufactured by International Business Machines of White Plains, New York; or those manufactured by Advanced Micro Devices of Sunnyvale, California. The computing device 900 may be based on any of these processors, or any other processor capable of operating as described herein.

The main memory unit 922 may be one or more memory chips capable of storing data and allowing any storage location to be directly accessed by the central processing unit 921, such as any type or variant of Static random access memory (SRAM), Dynamic random access memory (DRAM), Ferroelectric RAM (FRAM), NAND Flash, NOR Flash and Solid State Drives (SSD). The main memory unit 922 may be based on any of the above described memory chips, or any other available memory chips capable of operating as described herein. In the embodiment shown in FIG. 9A, the central processing unit 921 communicates with main memory unit 922 via a system bus 980 (described in more detail below). FIG. 9B depicts an embodiment of a computing device 900 in which the processor communicates directly with the main memory unit 922 via a memory port 903. For example, in FIG. 9B the main memory unit 922 may be DRDRAM.

FIG. 9B depicts an embodiment in which the central processing unit 921 communicates directly with cache memory 940 via a secondary bus, sometimes referred to as a backside bus. In other embodiments, the central processing unit 921 communicates with cache memory 940 using the system bus 980. Cache memory 940 typically has a faster response time than main memory unit 922 and is provided by, for example, SRAM, BSRAM, or EDRAM. In the embodiment shown in FIG. 9B, the central processing unit 921 communicates with various I/O devices 930 via a local system bus 980. Various buses may be used to connect the central processing unit 921 to any of the I/O devices 930, for example, a VESA VL bus, an ISA bus, an EISA bus, a MicroChannel Architecture (MCA) bus, a PCI bus, a PCI-X bus, a PCI-Express bus, or a NuBus. For embodiments in which the I/O device is a video display 924, the central processing unit 921 may use an Advanced Graphics Port (AGP) to communicate with the display 924. FIG. 9B depicts an embodiment of a computer 900 in which the central processing unit 921 may communicate directly with I/O device 930b, for example via HYPERTRANSPORT, RAPIDIO, or INFINIBAND communications technology. FIG. 9B also depicts an embodiment in which local busses and direct communication are mixed: the central processing unit 921 communicates with I/O device 930a using a local interconnect bus while communicating with I/O device 930b directly.

A wide variety of I/O devices 930a-930n may be present in the computing device 900. Input devices include keyboards, mice, trackpads, trackballs, microphones, dials, touch pads, touch screens, and drawing tablets. Output devices include video displays, speakers, inkjet printers, laser printers, projectors and dye-sublimation printers. The I/O devices may be controlled by an I/O controller 923 as shown in FIG. 9A. The I/O controller may control one or more I/O devices such as a keyboard 926 and a pointing device 927, e.g., a mouse or optical pen. Furthermore, an I/O device may also provide storage and/or an installation device 916 for the computing device 900. In still other embodiments, the computing device 900 may provide USB connections (not shown) to receive handheld USB storage devices such as the USB Flash Drive line of devices manufactured by Twintech Industry, Inc., of Los Alamitos, California.

Referring again to FIG. 9A, the computing device 900 may support any suitable installation device 916, such as a disk drive, a CD-ROM drive, a CD-R/RW drive, a DVD-ROM drive, a flash memory drive, tape drives of various formats, USB device, hard-drive, a network interface, or any other device suitable for installing software and programs. The computing device 900 may further include a storage device, such as one or more hard disk drives or redundant arrays of independent disks, for storing an operating system and other related software, and for storing application software programs such as any program or software 920 for implementing (e.g., configured and/or designed for) the systems and methods described herein. Optionally, any of the installation devices 916 could also be used as the storage device. Additionally, the operating system and the software can be run from a bootable medium.

Furthermore, the computing device 900 may include a network interface 918 to interface to the network 203 through a variety of connections including, but not limited to, standard telephone lines, LAN or WAN links (e.g., 802.11, T1, T3, 56 kb, X.25, SNA, DECNET), broadband connections (e.g., ISDN, Frame Relay, ATM, Gigabit Ethernet, Ethernet-over-SONET), wireless connections, or some combination of any or all of the above. Connections can be established using a variety of communication protocols (e.g., TCP/IP, IPX, SPX, NetBIOS, Ethernet, ARCNET, SONET, SDH, Fiber Distributed Data Interface (FDDI), RS232, IEEE 802.11, IEEE 802.11a, IEEE 802.11b, IEEE 802.11g, IEEE 802.11n, IEEE 802.11ac, IEEE 802.11ad, CDMA, GSM, WiMax and direct asynchronous connections). In one embodiment, the computing device 900 communicates with other computing devices 900' via any type and/or form of gateway or tunneling protocol such as Secure Socket Layer (SSL) or Transport Layer Security (TLS). The network interface 918 may include a built-in network adapter, network interface card, PCMCIA network card, card bus network adapter, wireless network adapter, USB network adapter, modem or any other device suitable for interfacing the computing device 900 to any type of network capable of communication and performing the operations described herein.

In some implementations, the computing device 900 may include or be connected to one or more display devices 924a-924n. As such, any of the I/O devices 930a-930n and/or the I/O controller 923 may include any type and/or form of suitable hardware, software, or combination of hardware and software to support, enable or provide for the connection and use of the display device(s) 924a-924n by the computing device 900. For example, the computing device 900 may include any type and/or form of video adapter, video card, driver, and/or library to interface, communicate, connect or otherwise use the display device(s) 924a-924n. In one embodiment, a video adapter may include multiple connectors to interface to the display device(s) 924a-924n. In other embodiments, the computing device 900 may include multiple video adapters, with each video adapter connected to the display device(s) 924a-924n. In some implementations, any portion of the operating system of the computing device 900 may be configured for using multiple displays 924a-924n. One ordinarily skilled in the art will recognize and appreciate the various ways and embodiments that a computing device 900 may be configured to have one or more display devices 924a-924n.

In further embodiments, an I/O device 930 may be a bridge between the system bus 980 and an external communication bus, such as a USB bus, an Apple Desktop Bus, an RS-232 serial connection, a SCSI bus, a FireWire bus, a FireWire 500 bus, an Ethernet bus, an AppleTalk bus, a Gigabit Ethernet bus, an Asynchronous Transfer Mode bus, a FibreChannel bus, a Serial Attached small computer system interface bus, a USB connection, or a HDMI bus.

A computing device 900 of the sort depicted in FIGS. 9A and 9B may operate under the control of an operating system, which control scheduling of tasks and access to system resources. The computing device 900 can be running any operating system, such as any of the versions of the MICROSOFT WINDOWS operating systems, the different releases of the Unix and Linux operating systems, any version of the MAC OS for Macintosh computers, any embedded operating system, any real-time operating system, any open source operating system, any proprietary operating system, any operating systems for mobile computing devices, or any other operating system capable of running on the computing device and performing the operations described herein. Typical operating systems include, but are not limited to, Android, produced by Google Inc.; WINDOWS 7 and 8, produced by Microsoft Corporation of Redmond, Washington; MAC OS, produced by Apple Computer of Cupertino, California; WebOS, produced by Research In Motion (RIM); OS/2, produced by International Business Machines of Armonk, New York; and Linux, a freely-available operating system distributed by Caldera Corp. of Salt Lake City, Utah, or any type and/or form of a Unix operating system, among others.

The computer system 900 can be any workstation, telephone, desktop computer, laptop or notebook computer, server, handheld computer, mobile telephone or other portable telecommunications device, media playing device, a gaming system, mobile computing device, or any other type and/or form of computing, telecommunications or media device that is capable of communication. The computer system 900 has sufficient processor power and memory capacity to perform the operations described herein.

In some implementations, the computing device 900 may have different processors, operating systems, and input devices consistent with the device. For example, in one embodiment, the computing device 900 is a smart phone, mobile device, tablet or personal digital assistant. In still other embodiments, the computing device 900 is an Android-based mobile device, an iPhone smart phone manufactured by Apple Computer of Cupertino, California, or a Blackberry or WebOS-based handheld device or smart phone, such as the devices manufactured by Research In Motion Limited. Moreover, the computing device 900 can be any workstation, desktop computer, laptop or notebook computer, server, handheld computer, mobile telephone, any other computer, or other form of computing or telecommunications device that is capable of communication and that has sufficient processor power and memory capacity to perform the operations described herein.

Although the disclosure may reference one or more "users", such "users" may refer to user-associated devices or stations (STAs), for example, consistent with the terms "user" and "multi-user" typically used in the context of a multi-user multiple-input and multiple-output (MU-MIMO) environment.

Although examples of communications systems described above may include devices operating according to an 802.11 standard, it should be understood that embodiments of the systems and methods described can operate according to other standards and use wireless communications devices other than devices configured as devices and APs. For example, multiple-unit communication interfaces associated with cellular networks, satellite communications, vehicle communication networks, and other non-802.11 wireless networks can utilize the systems and methods described herein to achieve improved overall capacity and/or link quality without departing from the scope of the systems and methods described herein.

It should be noted that certain passages of this disclosure may reference terms such as "first" and "second" in connection with devices, mode of operation, transmit chains, antennas, etc., for purposes of identifying or differentiating one from another or from others. These terms are not intended to merely relate entities (e.g., a first device and a second device) temporally or according to a sequence, although in some cases, these entities may include such a relationship. Nor do these terms limit the number of possible entities (e.g., devices) that may operate within a system or environment.

It should be understood that the systems described above may provide multiple ones of any or each of those components and these components may be provided on either a standalone machine or, in some implementations, on multiple machines in a distributed system. In addition, the systems and methods described above may be provided as one or more computer-readable programs or executable instructions embodied on or in one or more articles of manufacture. The article of manufacture may be a floppy disk, a hard disk, a CD-ROM, a flash memory card, a PROM, a RAM, a ROM, or a magnetic tape. In general, the computer-readable programs may be implemented in any programming language, such as LISP, PERL, C, C++, C #, PROLOG, or in any byte code language such as JAVA. The software programs or executable instructions may be stored on or in one or more articles of manufacture as object code.

While the foregoing written description of the methods and systems enables one of ordinary skill to make and use what is considered presently to be the best mode thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

What is claimed is:

1. A system, comprising:
    a renewable energy power plant coupled to an energy grid, the renewable energy power plant comprising a battery energy storage system (BESS);
    a device operating within the renewable energy power plant, the device having energy requirements and receiving energy from the BESS;
    a renewable energy source (RES); and
    a processor, the processor operatively coupled to computer memory and configured by machine-readable instructions to:
        determine the BESS is not charging with energy from the energy grid and is not discharging energy to the energy grid; and
        responsive to (i) the determination that the BESS is not charging with energy from the energy grid and is not discharging energy to the energy grid, and (ii) determining the energy requirements of the device are currently not satisfied:
            identify an amount of energy that is needed to satisfy the energy requirements of the device in combination with energy provided by the BESS to the device; and
            direct the identified amount of energy from the RES to the device by changing a state of a switch directing energy from the RES to the device, wherein the processor is configured to direct the identified amount of energy from the RES to the device by ensuring, over time, a load energy meter measuring energy received from the energy grid and directed to the energy grid measures a value of zero.

2. The system of claim 1, wherein the processor is configured to determine the BESS is not charging with energy from the energy grid or discharging energy to the energy grid by determining the BESS is not charging with energy from the energy grid or discharging energy to the energy grid based on a charge/discharge schedule for the BESS.

3. A system, comprising:
    a renewable energy power plant coupled to an energy grid, the renewable energy power plant comprising a battery energy storage system (BESS);
    a device operating within the renewable energy power plant, the device having energy requirements and receiving energy from the BESS;
    a renewable energy source (RES);
    a load energy meter measuring energy provided to and received from the energy grid;
    a processor, the processor operatively coupled to computer memory and configured by machine-readable instructions to:
        determine the BESS is not charging with energy from the energy grid and is not discharging energy to the energy grid responsive to a value of the load energy meter being below a threshold; and
        responsive to (i) the determination that the BESS is not charging with energy from the energy grid and is not discharging energy to the energy grid, and (ii) determining the energy requirements of the device are currently not satisfied:
            identify an amount of energy that is needed to satisfy the energy requirements of the device in combination with energy provided by the BESS to the device; and
            direct the identified amount of energy from the RES to the device by changing a state of a switch directing energy from the RES to the device.

4. The system of claim 1, wherein the processor is further configured to:

charge a second BESS with energy generated by the RES during a first time period;

determine the BESS is not providing enough energy to satisfy the energy requirements of the device during a second time period subsequent to the first time period;

calculate a second amount of energy that is needed to satisfy the energy requirements of the device in combination with energy provided by the BESS; and discharge the calculated second amount of energy from the second BESS to the device during the second time period.

5. The system of claim 4, wherein the processor is configured to determine the BESS is not providing enough energy to satisfy the energy requirements of the device by determining the BESS in combination with the RES is not providing enough energy to satisfy the energy requirements of the device during the second time period; and wherein the processor is configured to calculate the second amount of energy by calculating the second amount of energy that is needed to satisfy the energy requirements of the device in combination with energy provided by the BESS and the RES.

6. The system of claim 1, further comprising:

a load energy meter measuring energy provided to and received from the energy grid, wherein the load energy meter is coupled in series between the device and the energy grid.

7. A method, comprising:

determining, by a processor, a battery energy storage system (BESS) of a renewable energy power plant is not charging with energy from an energy grid or discharging energy to the energy grid; and responsive to the determining the BESS is not charging with energy from the energy grid and is not discharging energy to the energy grid, and (ii) determining the energy requirements of a device operating in the renewable energy power plant are currently not satisfied:

identifying, by the processor, an amount of energy that is needed to satisfy the energy requirements of the device operating in the renewable energy power plant in combination with energy provided by the BESS to the device; and directing, by the processor, the identified amount of energy from a renewable energy source (RES) to the device by changing a state of a switch directing energy from the RES to the device, wherein directing the identified amount of energy comprises ensuring, by the processor over time, a load energy meter measuring energy received from the energy grid and directed to the energy grid measures a value of zero.

8. The method of claim 7, wherein determining the BESS is not charging with energy from the energy or discharging energy to the energy grid comprises determining, by the processor, the BESS is not charging with energy from the energy grid or discharging energy to the energy grid based on a charge/discharge schedule for the BESS.

9. The method of claim 7, further comprising:

charging, by the processor, a second BESS with energy generated by the RES during a first time period;

determining, by the processor, the BESS is not providing enough energy to satisfy the energy requirements of the device during a second time period subsequent to the first time period;

calculating, by the processor, a second amount of energy that is needed to satisfy the energy requirements of the device in combination with energy provided by the BESS to the device; and discharging, by the processor, the calculated second amount of energy from the second BESS to the device during the second time period.

10. The method of claim 9, wherein determining the BESS is not providing enough energy to satisfy the energy requirements of the device comprises determining, by the processor, the BESS is not providing enough energy to satisfy the energy requirements of the device during the second time period; and wherein calculating the second amount of energy comprises calculating, by the processor, the second amount of energy that is needed to satisfy the energy requirements of the device in combination with energy provided by the BESS.

11. The method of claim 9, further comprising:

determining, by the processor, the second time period is a time period in which the RES does not generate energy;

wherein discharging the calculated second amount of energy from the second BESS comprises discharging, by the processor, the calculated second amount of energy from the second BESS in response to determining the second time period is a time period in which the RES does not generate energy.

12. The method of claim 7, further comprising: measuring, by the processor, a load energy meter coupled in series between the device and the energy grid.

13. The method of claim 7, wherein identifying the amount of energy that is needed to satisfy the energy requirements of the device in combination with energy provided by the BESS is performed at a first time, and further comprising:

identifying, by the processor at a second time subsequent to the first time, a second amount of energy that is needed to satisfy the energy requirements of the device in combination with energy provided by the BESS, the second amount of energy higher than the amount of energy and resulting from parasitic losses of a transformer of the BESS in an idle state; and directing, by the processor, the identified second amount of energy from the RES to the device.

14. The method of claim 7, wherein directing the identified amount of energy from the RES to the device comprises directing, by the processor, the identified amount of energy from the RES to the device without transferring any energy to the BESS from the RES.

15. The method of claim 7, wherein the device is a heating ventilation and air conditioning (HVAC) device.

16. The method of claim 7, further comprising:

charging a second BESS with energy generated by the RES during a first time period;

determining the BESS is not providing enough energy to satisfy the energy requirements of the device during a second time period subsequent to the first time period; and during the second time period:

discharging, by the processor, energy from the second BESS to the device during the second time period; and increasing, by the processor, the energy being discharged from the second BESS to the device until measuring a value from a load energy meter equal to zero or a defined threshold, the load energy meter measuring energy provided to and received from the energy grid.

17. The method of claim 7, further comprising:
establishing, by the processor, a connection with a second processor controlling the BESS;
receiving, by the processor, a state of charge of the BESS or a request for energy from the second processor; and
directing, by the processor, energy from the RES to the BESS based on the received state of charge or the request for energy from the second processor.

18. A system, comprising:
a renewable energy power plant coupled to an energy grid, the renewable energy power plant comprising a battery energy storage system (BESS);
a device operating within the renewable energy power plant, the device having energy requirements and receiving energy from the BESS;
a renewable energy source (RES); and
a processor, the processor operatively coupled to computer memory and configured by machine-readable instructions to:
determine the BESS is not charging with energy from the energy grid and is not discharging energy to the energy grid; and
responsive to (i) the determination that the BESS is not charging with energy from the energy grid and is not discharging energy to the energy grid, and (ii) determining the energy requirements of the device are currently not satisfied:
identify an amount of energy that is needed to satisfy the energy requirements of the device in combination with energy provided by the BESS to the device, wherein the processor is configured to identify the amount of energy by identifying a value from a load energy meter measuring energy provided to and received from the energy grid; and
direct the identified amount of energy from the RES to the device by changing a state of a switch directing energy from the RES to the device.

19. The system of claim 1, wherein the processor is configured to identify an amount of energy that is needed to satisfy the energy requirements of the device in combination with energy provided by the BESS to the device by identifying a measurement from the load energy meter measuring energy provided to and received from the energy grid.

* * * * *